(12) United States Patent
Kajiwara et al.

(10) Patent No.: US 7,151,016 B2
(45) Date of Patent: Dec. 19, 2006

(54) METHOD OF MANUFACTURING A SEMICONDUCTOR DEVICE THAT INCLUDES A HYDROGEN CONCENTRATION DEPTH PROFILE

(75) Inventors: Masayuki Kajiwara, Kanagawa-ken (JP); Ritsuko Nagao, Kanagawa-ken (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/193,681

(22) Filed: Jul. 12, 2002

(65) Prior Publication Data

US 2003/0020118 A1 Jan. 30, 2003

(30) Foreign Application Priority Data

Jul. 17, 2001 (JP) ............................ 2001-217315

(51) Int. Cl.
*H01L 21/00* (2006.01)

(52) U.S. Cl. ............... 438/149; 438/151; 438/652; 438/173

(58) Field of Classification Search ............... 438/151, 438/154, 157, 161, 163, 164, 322, 673, 149, 438/652, 713

See application file for complete search history.

(56) References Cited

U.S. PATENT DOCUMENTS

| 4,319,395 | A | * | 3/1982 | Lund et al. ............... 438/232 |
| 5,292,675 | A | * | 3/1994 | Codama .................. 438/163 |
| 5,397,718 | A | * | 3/1995 | Furuta et al. ............. 438/158 |
| 5,719,065 | A | * | 2/1998 | Takemura et al. ......... 438/163 |
| 6,274,443 | B1 | * | 8/2001 | Yu et al. |
| 6,706,568 | B1 | * | 3/2004 | Nakajima ................ 438/149 |
| 2001/0031519 | A1 | * | 10/2001 | Ayres et al. |
| 2001/0041392 | A1 | | 11/2001 | Suzawa et al. |
| 2002/0000551 | A1 | | 1/2002 | Yamazaki et al. |
| 2002/0016028 | A1 | | 2/2002 | Arao et al. |
| 2002/0052192 | A1 | * | 5/2002 | Yamazaki et al. ......... 455/411 |
| 2002/0105033 | A1 | * | 8/2002 | Zhang |
| 2002/0164842 | A1 | * | 11/2002 | Nakajima ................ 438/149 |
| 2002/0182785 | A1 | * | 12/2002 | Miyairi .................. 438/149 |
| 2003/0032221 | A1 | * | 2/2003 | Kasahara et al. .......... 438/149 |

FOREIGN PATENT DOCUMENTS

| EP | 1 154 383 A2 | 11/2001 |
| JP | 06-148685 | 5/1994 |
| JP | 08-274336 | 3/1995 |
| JP | 07-235680 | 9/1995 |
| JP | 08-274336 | 10/1996 |

(Continued)

OTHER PUBLICATIONS

Stanley Wolf and Richard N. Tauber, Silicon Processing For The VLSI Era, Second Edition, Lattice Press, 2000, pp. 399-402.*

*Primary Examiner*—Michael Lebentritt
*Assistant Examiner*—Stanetta Isaac
(74) *Attorney, Agent, or Firm*—Fish & Richardson P.C.

(57) ABSTRACT

A method for manufacturing a semiconductor device having a circuit made up by a TFT (Thin Film Transistor) having GOLD (Gate-Drain Overlapped LDD) structure, which an LDD region overlaps which a portion of a gate electrode, wherein the formation of a concentration depth profile peak of hydrogen in a semiconductor film is avoided to thereby improve the electrical characteristics of the TFT. The use of the semiconductor film manufactured in this manner allows manufacturing of a semiconductor device with good electrical characteristics only by hydrogenating treatment even when the activation of impurity elements does not carried out.

48 Claims, 20 Drawing Sheets

FOREIGN PATENT DOCUMENTS

| | | |
|---|---|---|
| JP | 9-260671 | 10/1997 |
| JP | 2002-50636 | 2/2002 |
| JP | 2002-57165 | 2/2002 |
| JP | 2002-64107 | 2/2002 |

* cited by examiner

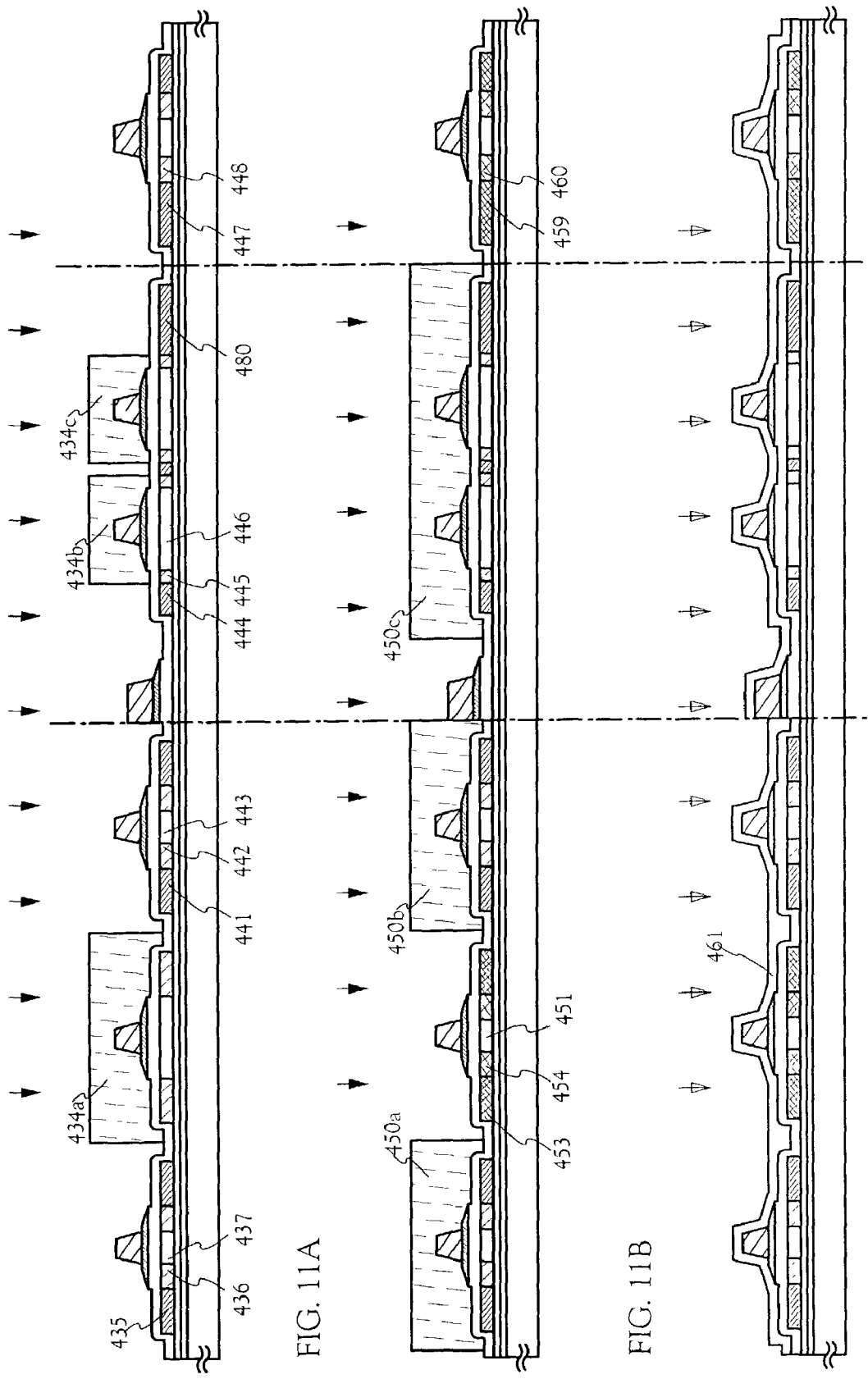

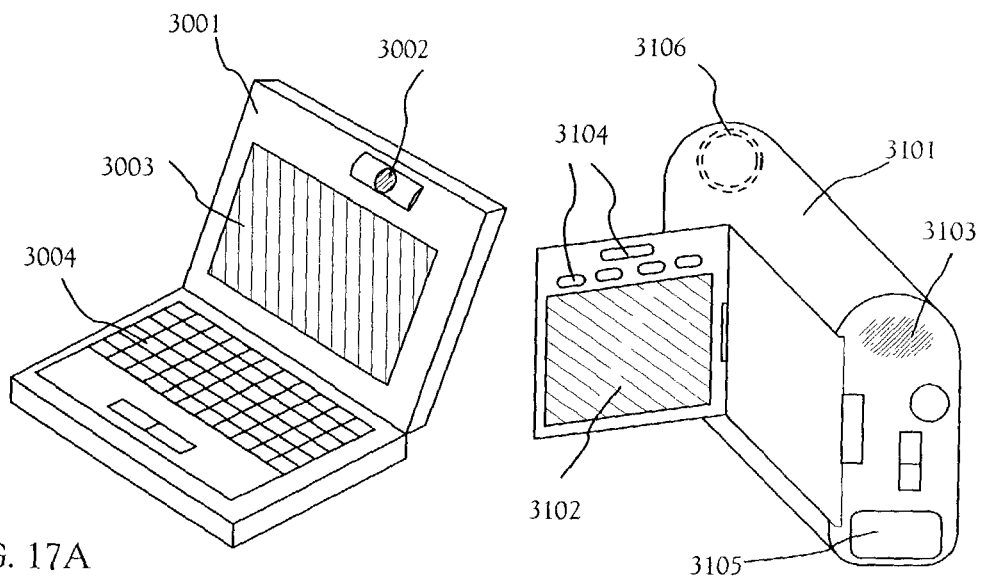
FIG. 17A
FIG. 17B
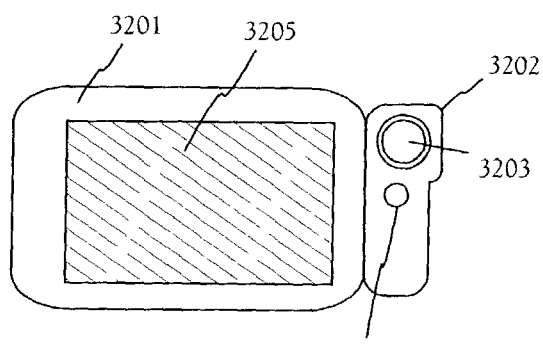
FIG. 17C
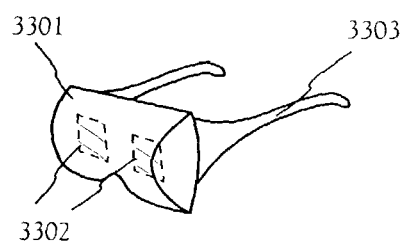
FIG. 17D
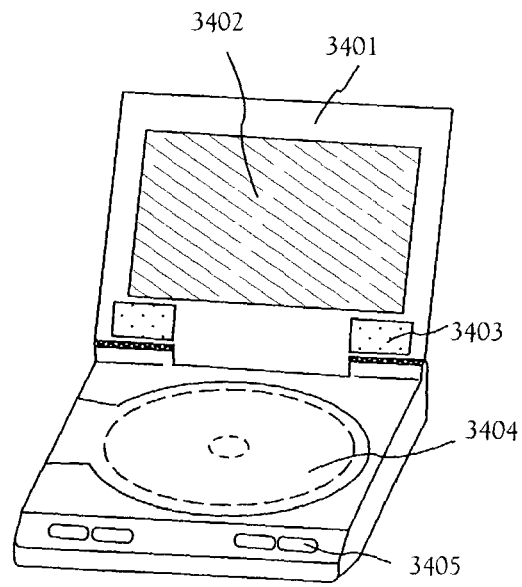
FIG. 17E
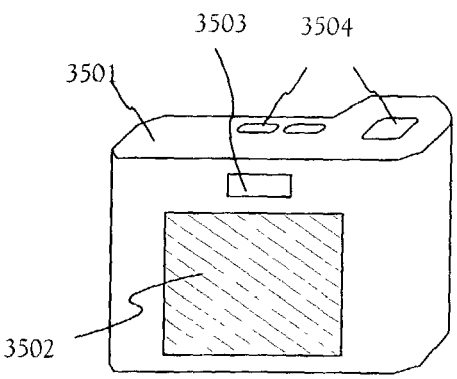
FIG. 17F

METHOD OF MANUFACTURING A SEMICONDUCTOR DEVICE THAT INCLUDES A HYDROGEN CONCENTRATION DEPTH PROFILE

BACKGROUND OF THE INVENTION

1. Field of the Invention

The present invention relates to a semiconductor device having a circuit made up by a thin film transistor (hereinafter referred to as TFT) and it's manufacturing method. More particularly, the invention relates to configurations of an electro-optic apparatus typified by a liquid crystal display, and of electronic equipment equipped with an electro-optic apparatus as a component thereof, and to their manufacturing method. Note that a semiconductor device herein means all devices, which can work by utilizing semiconductor characteristics, and the above-described electro-optic apparatus and electronic equipment fall under the category of such devices.

2. Description of the Related Art

In recent years, a thin film transistor (TFT) using a semiconductor thin film (approximately a-few-nm-thick to a-few-hundreds-nm-thick) formed on a substrate having an insulating surface has been constructed, and the development of a semiconductor device having a large area integrated circuit formed using this TFT has been pursued. An active-matrix liquid crystal display and a light emitting device are well known as a representative example of such device. Particularly, a TFT, wherein a crystal silicon film (typically, polycrystalline silicon film) is used as an active region, has a high field effect mobility, so that various functional circuits can be formed using such TFTs.

For example, in an active-matrix liquid crystal display, a pixel circuit for displaying an image for each function block, a shift register circuit built on a CMOS circuit, a level shifter circuit, a buffer circuit, and a drive circuit for controlling a pixel circuit such as a sampling circuit are formed on a single substrate. Additionally, an increase in substrate area is especially an essential element for enhancing a production efficiency. In recent years, the trends in increasing substrate area for improving a production efficiency have been becoming more remarkable, so that it is expected that a substrate having a edge size of more than 1 m will be used in a production plant in the future.

Incidentally, a pixel circuit of an active-matrix liquid crystal display has from tens to millions of pixels, each having a TFT (pixel TFT) arranged therein. Each of the pixel TFTs is provided with a pixel electrode. In the opposite substrate side across a liquid crystal, an opposite electrode is provided to form a kind of capacitor, which uses the liquid crystal as a dielectric substance. A voltage to be applied to each individual pixel is controlled by the switching function of the TFT to control an electric charge to be supplied to this capacitor, whereby driving the liquid crystal to control an amount of transmitted light and to display an image.

A pixel TFT serves as a switching element to apply a voltage to the liquid crystal and to drive it. The liquid crystal is driven with alternating current, so that a system referred to as a frame inverting drive is adopted in many cases. For this system, it is important to comprise pixel TFTs each having a characteristic that an OFF current value (drain current when a TFT is in an OFF state) is sufficiently low, for the purpose of keeping its power consumption low.

As TFT structure for reducing an OFF current value, the LDD (Lightly Doped Drain) structure is known. In this structure, there is provided a region lightly doped with an n-type impurity element or a p-type impurity element between a channel region and a source region or drain region formed by doping an n-type impurity element or p-type impurity element heavily, and this region is referred to as an LDD region. In addition, as means for preventing the deterioration of ON current values due to hot carriers, so-called GOLD (Gate-drain Overlapped LDD) structure is known, in which an LDD region is overlapped with a gate electrode with a gate insulating film interposed therebetween. It is known that this structure can relax a strong electric field in the vicinity of a drain to thereby prevent hot carriers from flowing into a drain and it is useful to prevent the occurrence of deterioration phenomena.

Incidentally, the energy of ions implanted into a semiconductor film in a process for introducing an impurity element is much larger than binding energies of elements making up the semiconductor film. As a result, ions implanted into the semiconductor film flick elements making up the semiconductor film out of the lattice points and cause defects in the crystalline. Therefore, after doping, thermal treatment is often carried out to restore the defects and to activate an implanted impurity element simultaneously. For this thermal treatment, a thermal annealing technique using a furnace annealer is most commonly used. The activation of impurity elements is an important process for making impurity element doped regions low resistance areas and making those regions serve as an LDD region, a source region, and a drain region.

Now, methods for introducing impurity elements include the plasma doping technique, ion doping technique, and ion implantation technique. The plasma doping technique and ion doping technique are methods for introducing ions without mass separation (non-mass separation type methods), and apparatuses for introducing impurity elements using these methods include a plasma doping apparatus and an ion doping apparatus (an ion shower doping apparatus). Further, the ion implantation technique is a method for separating in masses and introducing ions and an apparatus for introducing impurity elements using this method is the ion implanter.

With increasing the size of a substrate, however, the thermal annealing technique, which is carried out using a furnace annealer, is a contributing factor to low throughputs in manufacturing semiconductor devices. To minimize the use of a furnace annealer, a method whereby at least activation of impurity elements after doping is carried out by a laser annealing technique is conducive. However, there has been a problem with the laser annealing activation of impurity elements that electrical characteristics become worse compared with the thermal annealing technique using a furnace annealer.

For example, as for a GOLD structure TFT as shown in FIGS. 1A to 1E, a case where a p-channel TFT is manufactured will be described. A 50 nm-thick silicon nitride oxide film 11a (at a composition ratio of Si=32%, O=27%, N=24%, and H=17%), and then a 100 nm-thick silicon nitride oxide film 11b (at a composition ratio of Si=32%, O=59%, N=7%, and H=2%) are deposited as an underlying insulating layer 11 over a glass substrate 10 by the plasma CVD technique. On the underlying insulating layer 11, a 54 nm-thick amorphous silicon film is formed as a semiconductor film 12 by the plasma CVD technique, followed by forming a 115 nm-thick silicon nitride oxide film (at a composition ratio of Si=32%, O=59%, N=7%, and H=2%) as an insulating film 13 over the semiconductor film 12, and forming a first conductive film 14 and then a second conductive film 15 over the insulating film 13, where the first conductive film 14 and second conductive film 15 are formed as a 50 nm-thick TaN film and as a 370 nm-thick W (tungsten) film using a sputter technique, respectively. (FIG. 1A)

Subsequently, a resist 16a is formed over the second conductive film 15, and etched to form a gate electrode, where the etching is carried out under first and second etching conditions. In either etching condition, an ICP etching technique is used. However, according to the first condition, plasma is created under a pressure of 1 Pa with etching gases of $CF_4$, $Cl_2$, and $O_2$ at a gas flow rate ratio of 25:25:10 (sccm) to perform etching, while a coil electrode is applied with a 500W RF (13.56 MHz) power, and a substrate side (sample stage) is applied with a 20W RF (13.56 MHz) power, thereby to apply a negative self-bias voltage between them substantially. The insulating film 13, the first conductive film 14 and the second conductive film 15 are etched to be shown as reference numerals 19a, 18a and 17a, respectively (FIG. 1B). In the second etching condition, plasma is created under a pressure of 1 Pa with etching gases of $CF_4$ and $Cl_2$ at a gas flow rate ratio of 30:30 (sccm) to perform etching, while the coil electrode is applied with a 500W RF (13.56 MHz) power and the substrate side (sample stage) is applied with a 20W RF (13.56 MHz) power, thereby to apply a negative self-bias voltage between them substantially The resist 16a, the insulating film 19a, the first conductive film 18a and the second conductive film 17a are etched to be shown as reference numerals 16b, 19b, 18b and 17b (FIG. 1C).

In addition, a doping process is performed with $B_2H_6$ gas at an acceleration voltage of 60 keV, and a dose of $1.5\times10^{16}$ atoms/$cm^2$ using an ion doping apparatus, wherein a plasma generating method is of DC (direct current) arc discharge mode. Thus, a source or drain region 22, an LDD region 21 and a channel region 20 are formed (FIG. 1D). The DC arc discharge mode is a method for generating plasma by flowing direct current through a tungsten filament. Now, this method is herein referred to as a DC mode.

Subsequently, the activation of impurity elements is performed in various conditions. With a thermal annealing technique using a furnace annealer, the condition of 550° C. for four hours is adopted; with a laser annealing technique, the activation is performed using second harmonics of a YAG laser in the case of irradiating a top surface of a substrate (a surface where a device is to be formed is herein defined as a "top surface"), and in the case of irradiating a rear surface (a surface opposite from a surface where a device is to be formed is herein defined as a "rear surface"), provided that the activation is performed after the formation of a 50 nm-thick silicon oxide film 23 when carrying out a thermal annealing technique using a furnace annealer. The semiconductor films obtained by performing the different types of activation are used to manufacture TFTs, each having channel region design values of 8 μm both in length and width, and then the electrical characteristics of the resultant TFTs are measured. The results are shown in FIGS. 2A to 2C. FIG. 2A shows a case where a thermal annealing technique using a furnace annealer is used for activation. FIG. 2B shows a case where laser light irradiates the substrate from the top surface thereof. FIG. 2C shows a case where laser light irradiates the substrate from the rear surface.

The TFT of FIG. 2A exhibits a good S value (sub-threshold coefficient: a value of gate voltage required to cause a value of drain current to be changed by one order at logarithm scale), a high mobility and a large ON current value, so that it has characteristics enough to serve as a semiconductor device. The TFT of FIG. 2B, however, exhibits an unfavorable S value, a low ON current value and a low mobility. The TFT of FIG. 2C exhibits a higher mobility than that of FIG. 2B, but it varies widely within the substrate. Thus, when a laser annealing technique performs the activation of impurity elements, the electrical characteristics become worse compared with a thermal annealing technique using a furnace annealer.

Therefore, it is an object of the invention to achieve good electrical characteristics in a GOLD structure TFT. Also, it is another object of the invention to improve the operating characteristics, reliability and yield of a semiconductor device. Further, it is an object of the invention to reduce the manufacturing cost of semiconductor devices.

SUMMARY OF THE INVENTION

Also, we have manufactured TFTs and measured their electrical characteristics in the following cases other than the foregoing activation conditions: where a DC type ion doping apparatus is used to introduce impurity elements, and then any activation is not carried out; and where an AC type ion doping apparatus is used to introduce impurity elements, and then the activation of the impurity elements is carried out by irradiating a top surface of a substrate with laser light. The measured TFTs each had channel region design values of 8 μm both in length and width. The results are shown in FIGS. 3A and 3B. Now, an AC type ion doping apparatus is an apparatus for generating plasma by RF power with no filament.

Referring to FIG. 3A, there are shown the electrical characteristics of TFTs in the case of no activation, which are as poor as those in the case already shown in FIG. 2B where a DC type ion doping apparatus has been used to introduce impurity elements, and then the activation has been carried out by irradiating a top surface of a substrate with laser light. It can be thought that when the top surface of the substrate is irradiated with laser light, source and drain regions are activated, but an LDD region which a portion of a gate electrode overlaps is hardly activated because the LDD region is optically shielded by the gate electrode. However, both in the cases comparable poor electrical characteristics have been obtained, regardless of the presence or absence of activation by a laser annealing technique. Then, it can be inferred that an LDD region which a portion of a gate electrode overlaps has a contributing factor which affects electrical characteristics.

Referring to FIG. 3B, there are shown the electrical characteristics of TFTs in the case where an AC type ion doping apparatus has been used to introduce impurity elements, and then the activation has been carried out by irradiating a top surface of a substrate with laser light. In FIG. 2B, a S value lowers and an ON current value and mobility increase compared with the electrical characteristics of TFTs in the case already shown in FIG. 2B where a DC type ion doping apparatus has been used to introduce impurity elements, followed by irradiating a top surface of a substrate with laser light. This has shown that the electrical characteristics of TFTs in the case where an AC type ion doping apparatus has been used to introduce impurity elements are better than those in the case of using a DC type ion doping apparatus.

It can be thought from the experimental results that the degradation of electrical characteristics is not due to the difference in activation conditions but due to some difference in LDD region, which a portion of a gate electrode overlaps, resulting from the difference between ion doping apparatuses.

Therefore, we have investigated what difference results from the difference between ion doping apparatuses by the experiment, wherein a doping process with respect to silicon wafers has been performed using a DC type ion doping apparatus and an AC type ion doping apparatus with $B_2H_6$ gas at an acceleration voltage of 60 keV and with respective doses, at which the resultant depth profiles of B (boron) concentrations become substantially equal in both the ion doping apparatus. In particular, a dose in the case where a DC type ion doping apparatus was used was $2.0\times10^{16}$ atoms/cm$^2$, and a dose in the case where an AC type ion doping apparatus was used was $5.0\times10^{15}$ atoms/cm$^2$. The results are shown in FIGS. 4A and 4B, respectively. FIGS. 4A and 4B clearly show that while both the cases exhibit almost the same depth profiles of B concentrations, the depth profiles of H (hydrogen) concentrations are completely different between them. In this connection, a peak near a surface of each of the wafers arises from BHx and a second peak arises from $H_3$.

Further, in the case of a GOLD structure TFT shown in FIG. 1E, a 115 nm-thick silicon nitride oxide film and a TaN film having a taper portion with a thickness of 0 to 50 nm are located above an LDD region which a portion of a gate electrode overlaps. In addition, a thickness of a semiconductor film is 54 nm. According to the values derived from our experience, an ion stopping power of a TaN film is about 2.5 times as strong as a silicon film, and the silicon nitride oxide film has an ion stopping power approximately equal to that of a silicon film. With these values, it can be calculated the equivalent locations in the concentration depth profile in the silicon wafer, to the concentration depth profiles of B and H introduced into an LDD region which a portion of a gate electrode overlaps. Based on the calculation: 50 [nm]×2.5+ 115 [nm]=240 [nm], a discussion about the concentration depth profile of H in an LDD region which a portion of a gate electrode overlaps can be replaced with that of a film having a thickness over a depth range of 240 to 294 nm from a surface of the silicon wafer. FIG. 4A shows that a film thickness over a depth range of 240 to 294 nm corresponds to an H concentration depth profile peak. FIG. 4B shows that introduced H amounts in a film thickness over a depth range of 240 to 294 nm is about one-tenth of that of FIG. 4A.

In other words, it can be concluded that the degradation of electrical characteristics can arise even with the same activation condition can be traced to a large amount of H introduced in introducing impurity elements. If H is introduced in large quantity, defects in a semiconductor film become serious, so that the recovery of crystallinity is restricted even when undergoing thermal treatment. In addition, if a semiconductor film contains a high concentration of H, the H concentration becomes a contributing factor of degrading the film quality of the semiconductor film.

Therefore, the invention, according to a feature, avoids the formation of a concentration depth profile peak of H, which is produced by the ionization of hydride having an n-type impurity element or hydride having a p-type impurity element, in an LDD region which a portion of a gate electrode overlaps, thereby to reduce an H concentration in the semiconductor film and to make it possible to manufacture a TFT having good electrical characteristics even when activated with laser light. More specifically, according to the invention, an n-type impurity element or p-type impurity element is introduced into a semiconductor film at such an acceleration voltage that a concentration depth profile peak of H, which is produced by the ionization of hydride having an n-type impurity element or hydride having a p-type impurity element, is formed in a gate electrode, gate insulating film, or underlying insulating layer. In addition, the invention is applicable to the case of the activation through RTA (Rapid Thermal Annealing) as well as the case of the activation with laser light.

As for a ratio of hydrogen to an impurity element in an LDD region which a portion of a gate electrode overlaps, an H concentration peak due to $H_3$ of FIG. 4A is $4.0\times10^{21}$ atoms/cm$^3$ and a B concentration at that time is $5.0\times10^{19}$ atoms/cm$^3$, which shows that electrical characteristics become worse when B:H=1:80. Therefore, it is necessary to make an H concentration less than $4.0\times10^{21}$ atoms/cm$^3$, namely below 80 times a B concentration.

In addition, even when irradiating a top surface of a substrate with laser light, an electrode works to cut off laser light and the LDD region which a portion of a gate electrode overlaps is not exposed such irradiation, so that the invention, according to a feature, reduces an H concentration in the semiconductor film and performs only hydrogenating treatment without thermal treatment for the activation of impurity elements.

In this case, a TFT may have good electrical characteristics, when an H concentration is less than 80 times a B concentration, as described above.

The invention makes it possible to reduce an amount of H introduced into a semiconductor film more than a well-known method and to suppress the degradation of film quality. In addition, it facilitates the recovery of semiconductor film crystallinity carried out at the same time as the activation of impurity elements, during the thermal treatment after introducing the impurity elements. Besides, using a laser annealing technique or a RTA technique to activate impurity elements, the throughput of semiconductor device manufacturing can be improved and the cost of a semiconductor device can be reduced. This is especially useful in the case of large-sized substrates. Further, performing a hydrogenating treatment without any activation, reduction in the number of steps can be achieved. Using this semiconductor film, a TFT having good electrical characteristics can be manufactured, and the performance, reliability, and yield of a semiconductor device can be improved.

While ion doping apparatuses different in discharge mode have been used to compare H concentration depth profiles in the above-described experiments, the invention avoids the formation of a concentration depth profile peak of H in a semiconductor film, thereby to improve the electrical characteristics of a semiconductor device manufactured using the semiconductor film, and does not limit a plasma discharge mode. However, difference between discharge modes can lead to the variations between ion beams. In general, an alternating current mode involves a difficulty in increasing a dose rate, and a direct current mode enables a wide range of dosage rates. For this reason, the direct current mode is becoming mainstream as matters stand. However, the direct current mode has a tendency to introduce a large amount of H into a film. Consequently, although an apparatus wherein a magnetic field is applied to a beam to perform mass separation, as one of direct current mode apparatuses, has been fabricated, there has been a problem that such apparatus becomes complicated. An increase in complexity of an apparatus increases a price of the apparatus itself, and leads to an increase in semiconductor device cost.

The invention permits a reduction in H concentration in a film without using a complicated apparatus and increasing a cost of a semiconductor device.

While the above description has been made taking a P-channel TFT as a representative example, the invention is also applicable to an N-channel TFT. Further, in the invention other non-mass separation type doping apparatuses as well as an ion doping apparatus can be applied (e.g. a plasma doping apparatus).

BRIEF DESCRIPTION OF THE DRAWINGS

FIGS. 11A to 11C are cross-sectional views showing manufacturing steps of a pixel TFT and a drive circuit TFT of Embodiment 1;

FIGS. 17A to 17F are illustrations showing examples of the semiconductor device of Embodiment 4;

DESCRIPTION OF THE PREFERRED EMBODIMENTS

[Embodiment Mode 1]

Figure 1A:
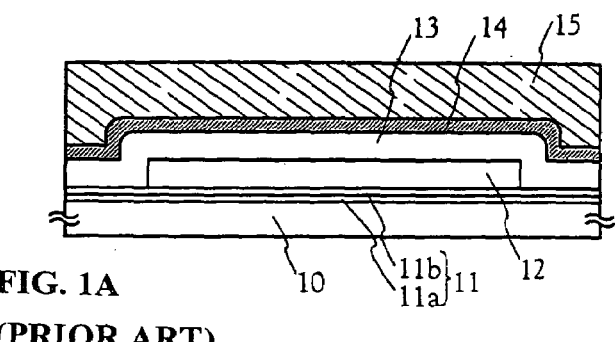
FIGS. 1A to 1E are schematic cross-sectional views of TFTs for illustrating successive steps performed to fabricate the TFTs.
Figure 1B:
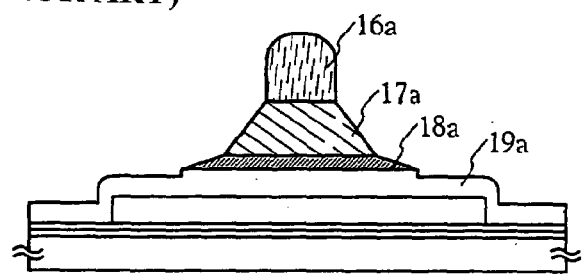

To confirm the effectiveness of the invention, the following experiment has been made. This experiment will be described with reference to FIGS. 1A to 1E. Now, a manufacturing method covered by FIGS. 1A to 1C is the same as described above, so that the description about those figures is omitted here.

Figure 1C:
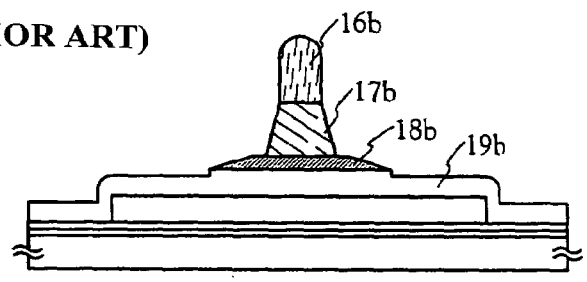
Figure 1D:
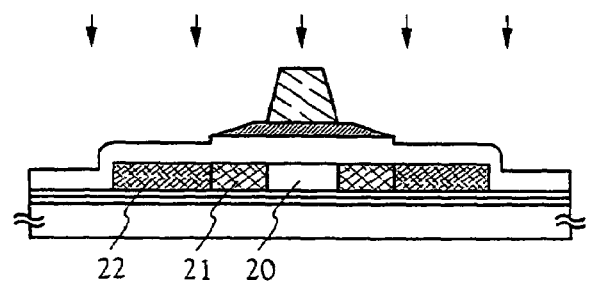
Figure 1E:
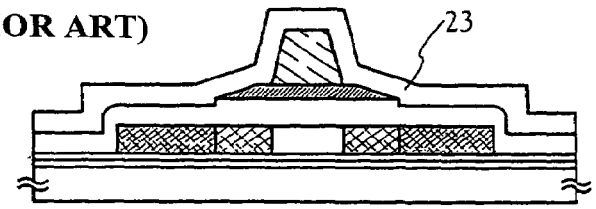
Figure 2A:
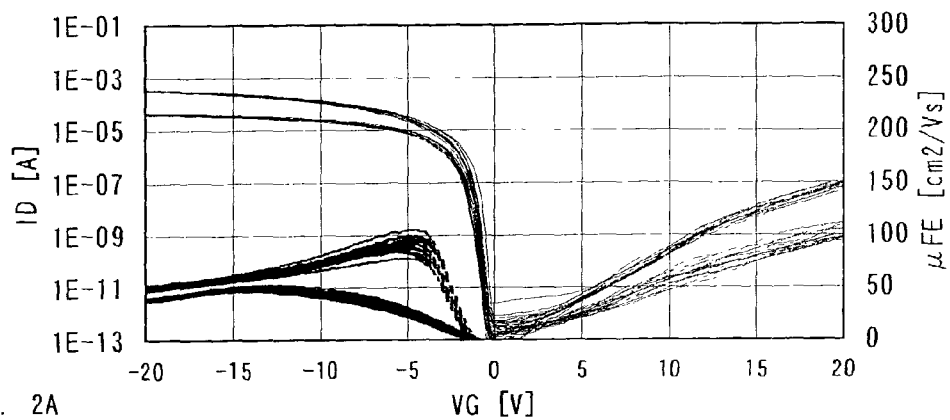
FIGS. 2A to 2C are graphs showing electrical characteristics of TFTs manufactured for experiments.
Figure 2B:
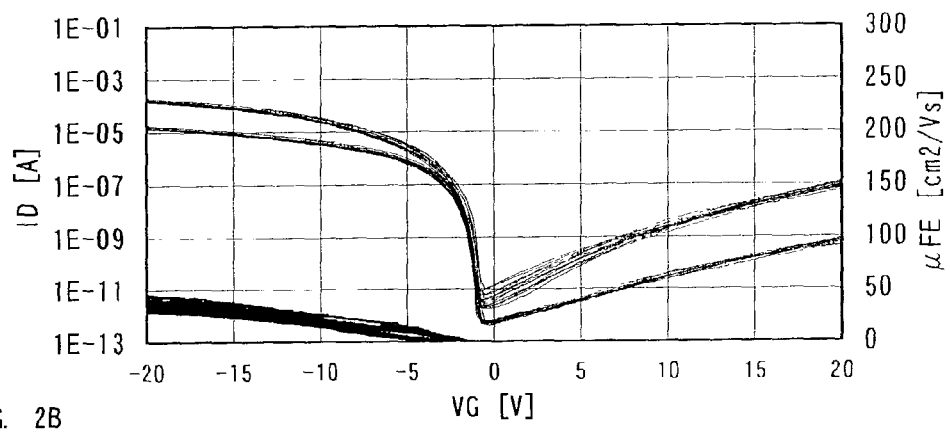
Figure 2C:
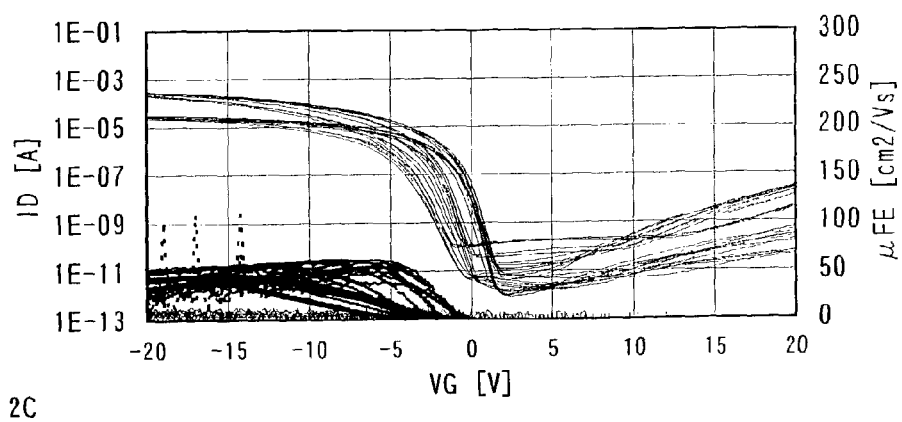
Figure 3A:
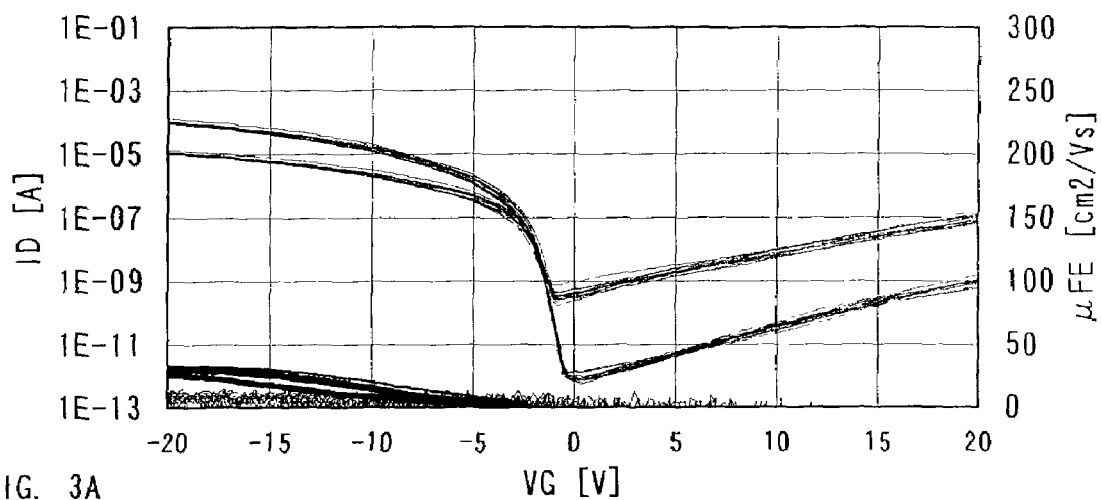
FIGS. 3A and 3B are graphs showing electrical characteristics of TFTs manufactured for experiments.
Figure 3B:
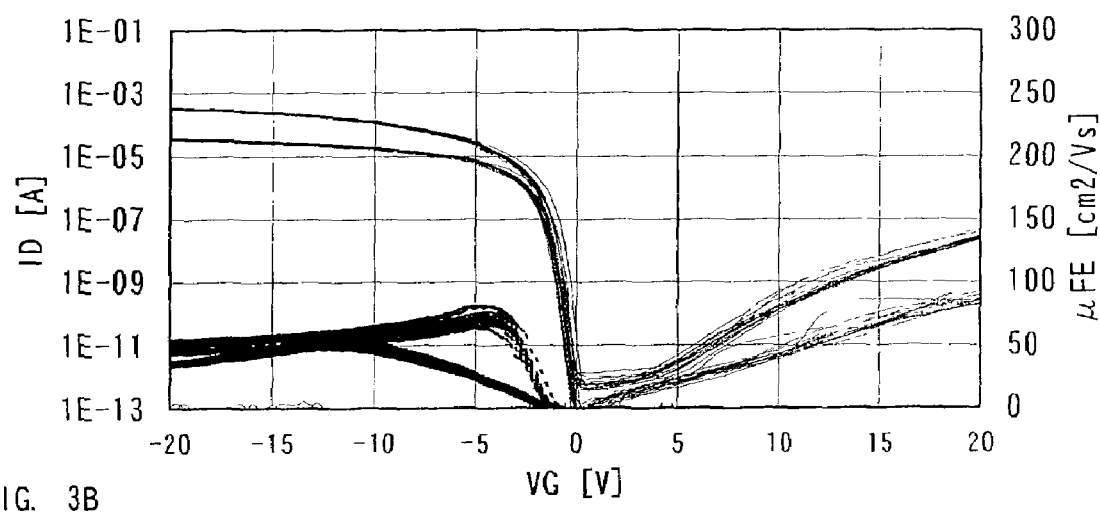
Figure 4A:
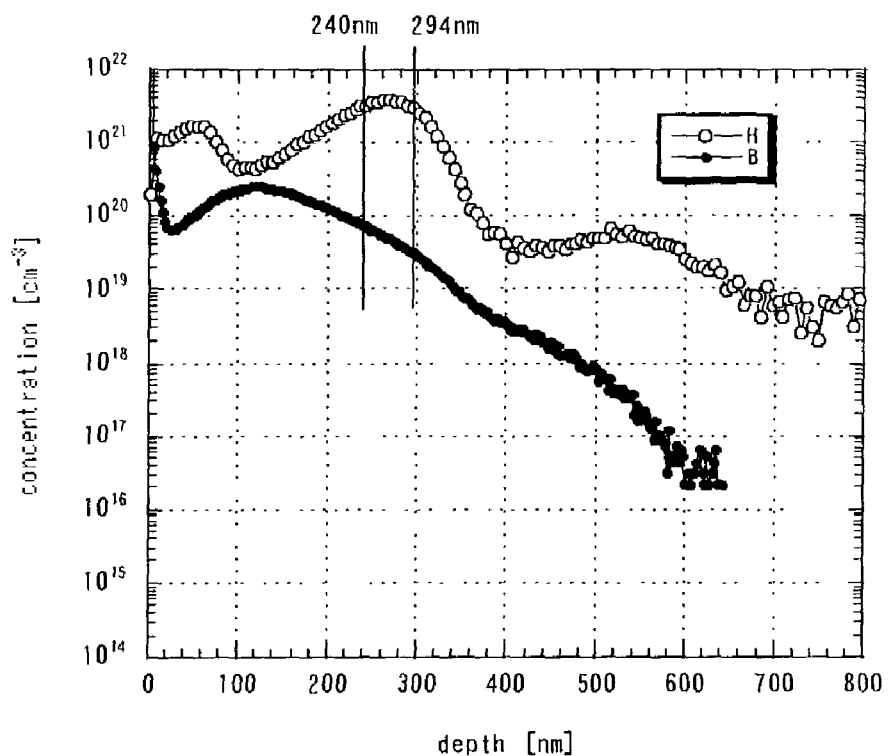
FIGS. 4A and 4B are graphs showing B and H concentration depth profiles.
Figure 4B:
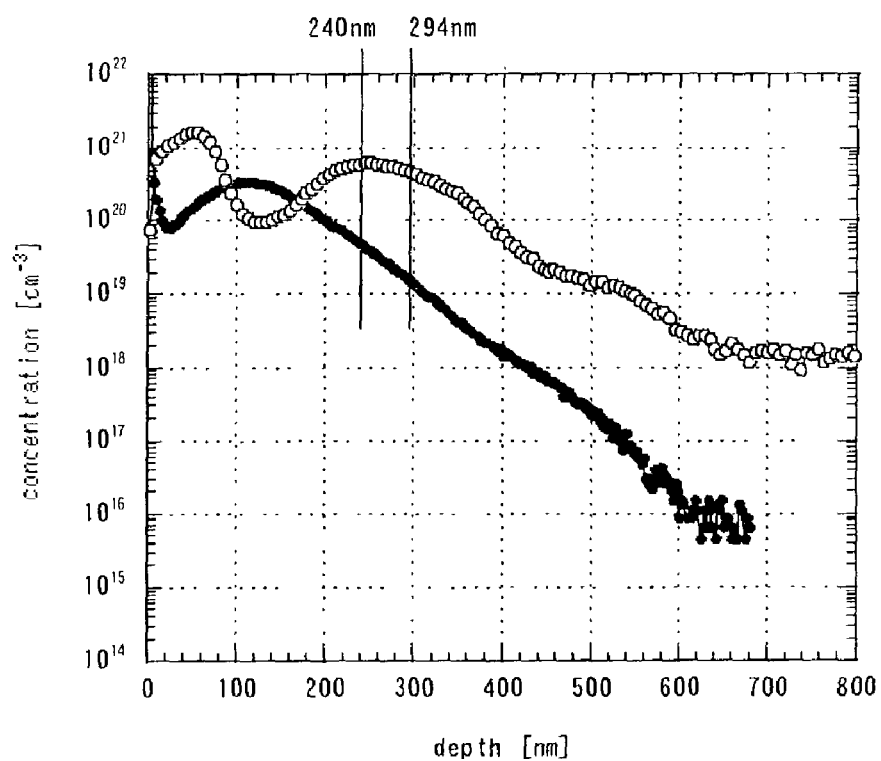
Figure 5:
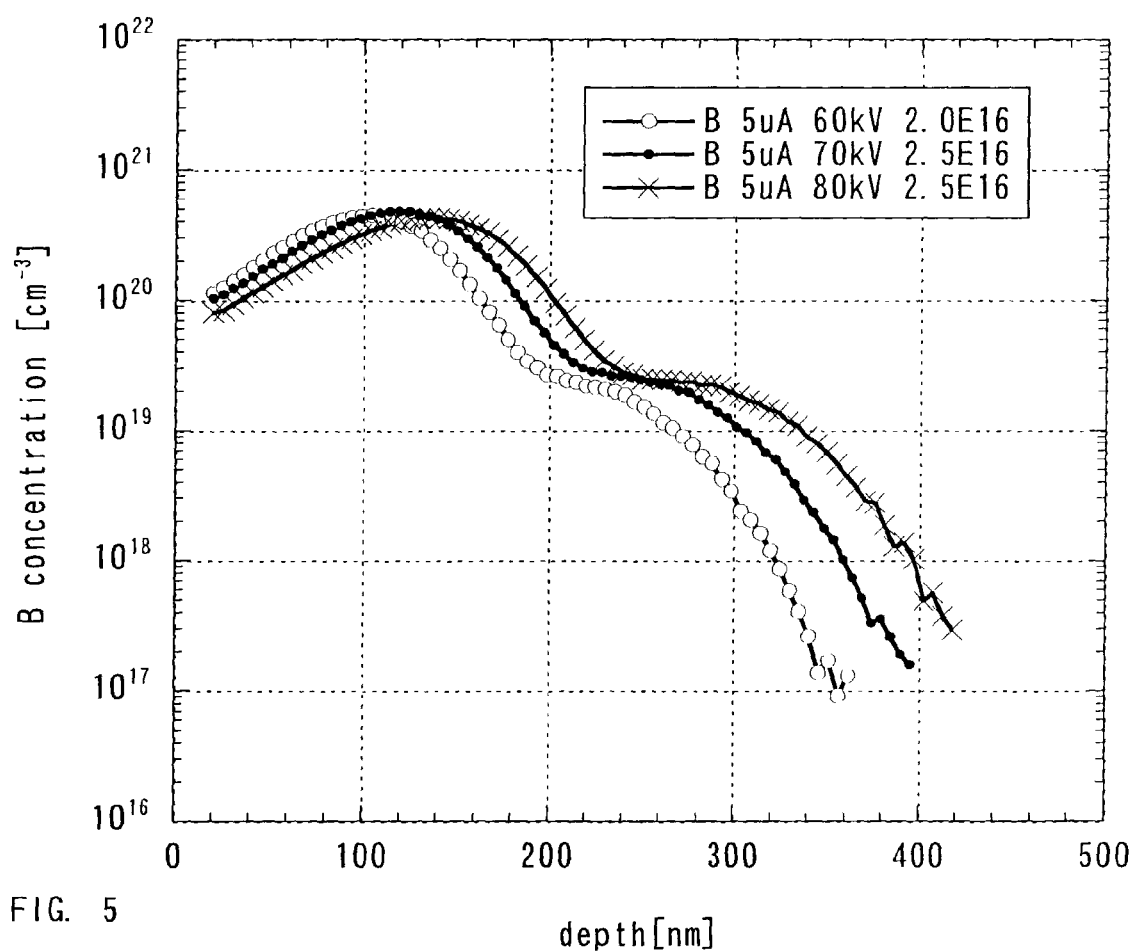
FIG. 5 is a graph showing a B concentration depth profile, wherein an acceleration voltage is used as a parameter of the present invention.
Figure 6A:
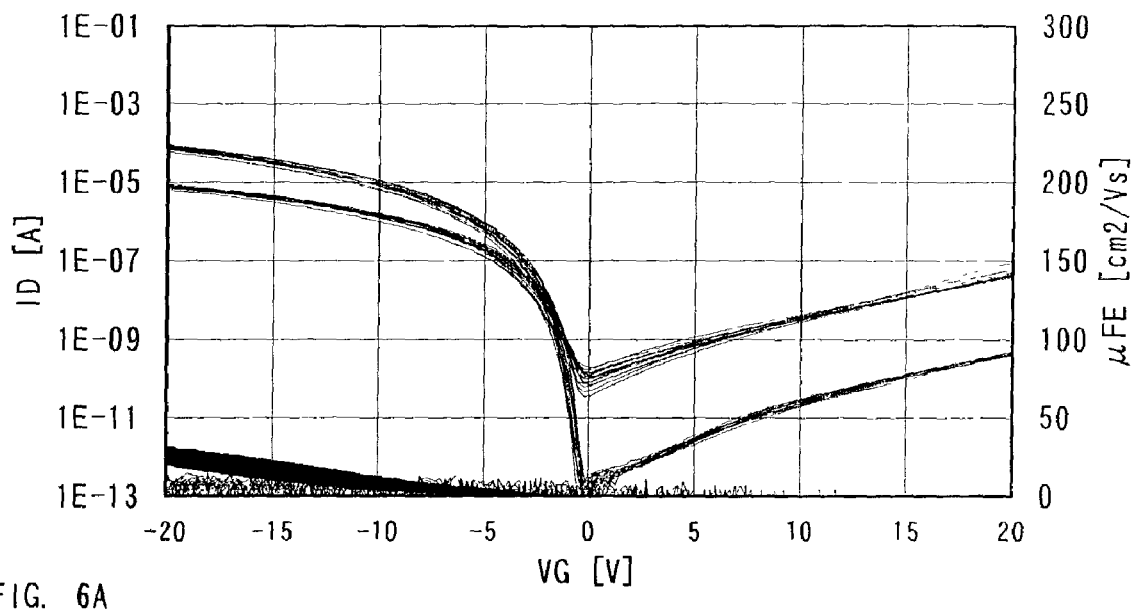
FIGS. 6A and 6B are graphs showing electrical characteristics of TFTs manufactured for experiments of the present invention.
Figure 6B:
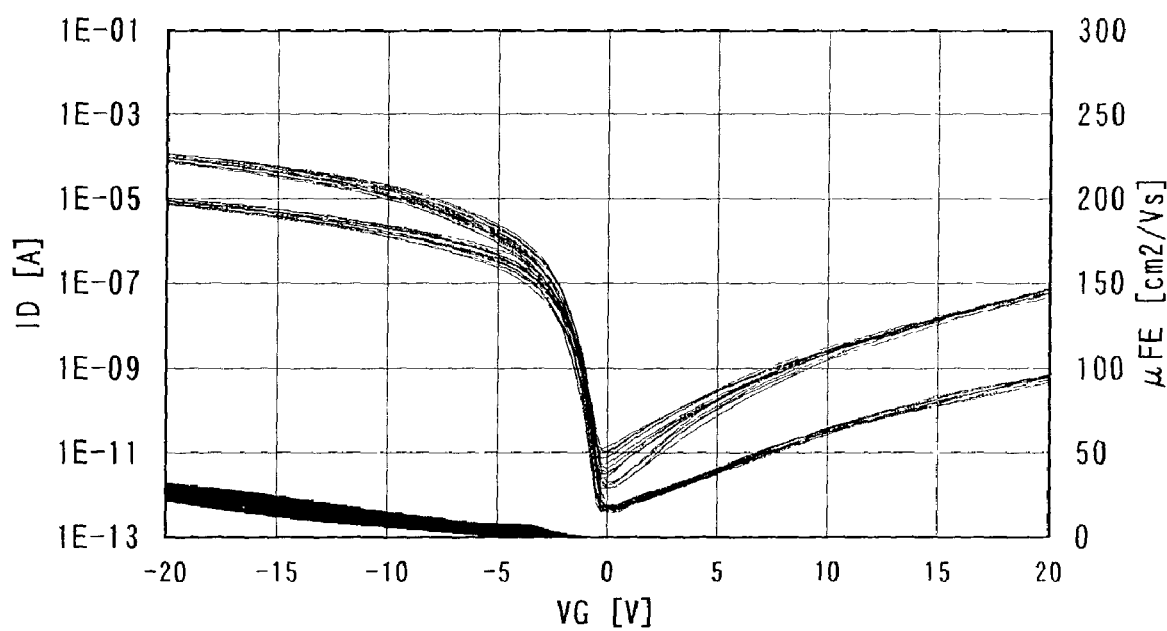
Figure 7A:
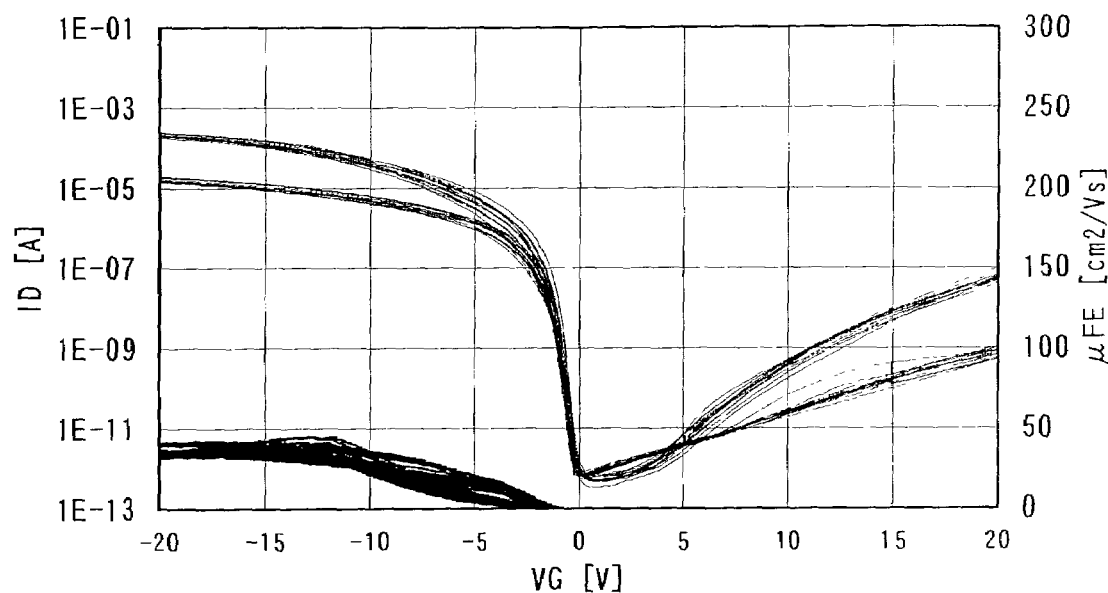
FIGS. 7A and 7B are graphs showing electrical characteristics of TFTs manufactured for experiments of the present invention.
Figure 7B:
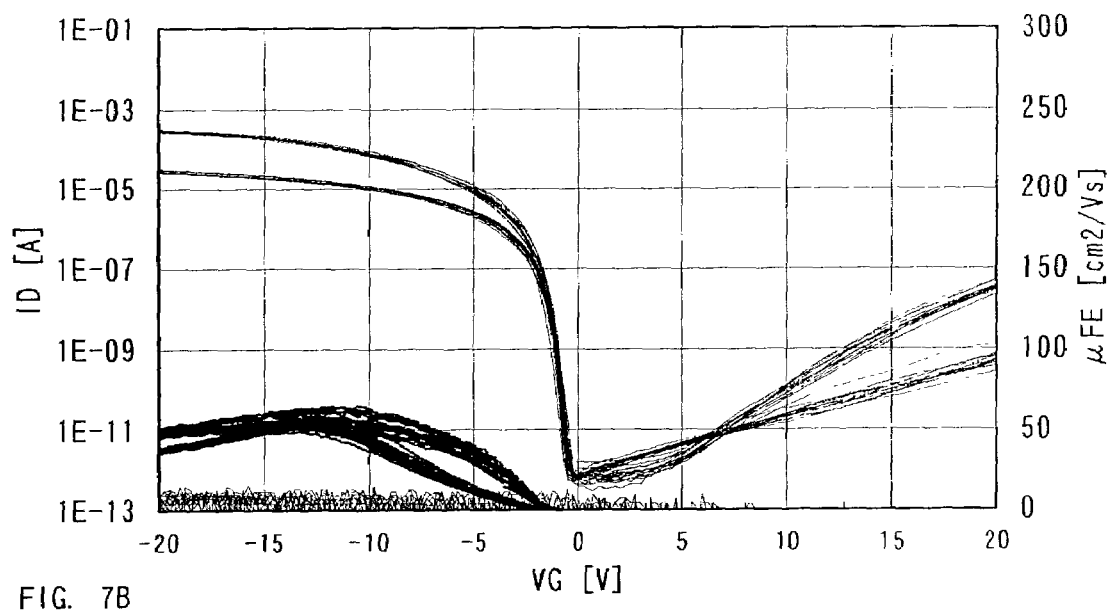

After the manufacturing steps up to FIG. 1C, impurity elements are introduced. In this embodiment mode, a doping process has been performed using a DC discharge type ion doping apparatus with $B_2H_6$ gas at acceleration voltages of 50 keV, 60 keV, 70 keV, and 80 keV, at doses of $2.0 \times 10^{16}$ atoms/cm$^2$ in the cases of 50 keV and 60 keV acceleration voltages and $2.5 \times 10^{16}$ atoms/cm$^2$ in the cases of 70 keV and 80 keV acceleration (FIG. 1D). The reason why a dose is changed depending on an acceleration voltage is to make B concentration depth profiles as identical as possible. B concentration depth profiles at 60 keV, 70 keV, and 80 keV are shown in FIG. 5. It is shown that a peak of a concentration depth profile is formed at a deeper position from a top surface with increasing acceleration voltage. While not shown here, an H concentration depth profile peak is formed at a deeper position from the top surface with increasing acceleration voltage, too.

Subsequently, a laser annealing technique or a RTA technique is applied for the activation of impurity elements. In this embodiment mode, a laser annealing technique has been applied and a substrate has been irradiated from a top surface thereof with second harmonics of a YAG laser. Of course, the laser is not limited to a YAG laser, for example, a pulsed or continuous-wave excimer laser or YAG laser, $YVO_4$ laser, YLF laser, $YAlO_3$ laser, glass laser, ruby laser, or Ti: sapphire laser may be used. A TFT has been manufactured using a semiconductor film formed in this manner and its electrical characteristics have been measured. The results are shown in FIGS. 6A to 6B and 7A to 7B. Now, the measurements have been made on TFTs, each having channel region design values of 8 μm both in length and width. FIGS. 6A, 6B, 7A, and 7B show TFT electrical characteristics in the cases of where acceleration voltages are 50 keV, 60 keV, 70 keV, and 80 keV, respectively.

FIGS. 6A to 6B and 7A to 7B show that an ON current value, a mobility and an S value are improved with increasing acceleration voltage. Thus, it has been confirmed that the formation of a concentration depth profile peak of introduced H in a semiconductor film can be avoided by increasing an acceleration voltage, and a TFT manufactured in this manner has good electrical characteristics.

[Embodiment Mode 2]

This embodiment mode is different from Embodiment Mode 1 in a method of avoiding the formation of a concentration depth profile peak of H, which is produced by the ionization of hydride having an n-type impurity element or hydride having a p-type impurity element, in an LDD region which a portion of a gate electrode overlaps. This method will be described with reference to FIGS. 1A to 1E and 8A to 8B. Now, as in the case of the first embodiment mode, a manufacturing method covered by FIGS. 1A to 1C is the same as described above, so that the description about those figures is omitted here. In addition, it is noted that a thickness of a TaN film 18b is 50 nm in this embodiment mode.

Figure 8A:
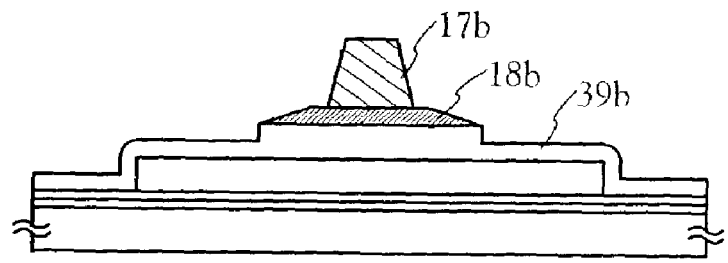
FIGS. 8A to 8D are schematic cross-sectional views of TFTs for illustrating successive steps performed to fabricate the TFTs of the present invention.
Figure 8B:
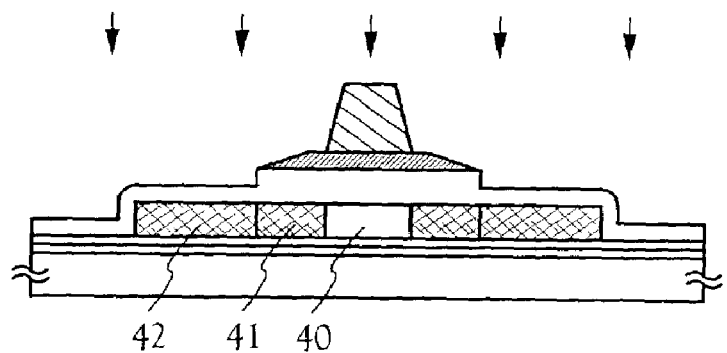
Figure 8C:
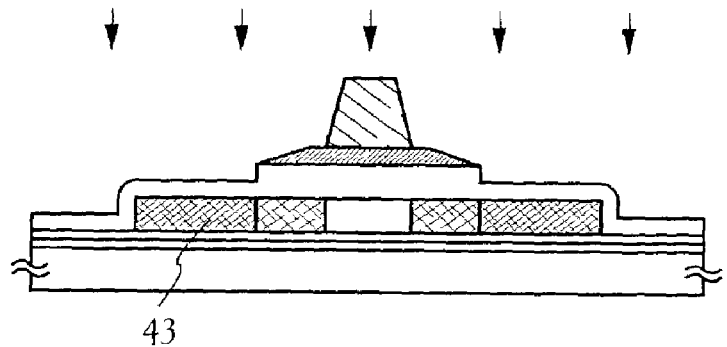

After the manufacturing steps up to FIG. 1C, an etching process is performed to decrease a thickness of an insulating film 39b adjacent to a semiconductor film used as a source region and a drain region up to a thickness less than or equal to 20 nm (FIG. 8A). In this embodiment mode, this thickness was 20 nm. Subsequently, an AC discharge type ion doping apparatus is used to carry out a first doping process and a second doping process. Specifically, the first doping process is performed at an acceleration voltage of 80 to 120 keV (FIG. 8B). In this embodiment mode, a doping process has been performed using an AC discharge type ion doping apparatus with $B_2H_6$ gas at an acceleration voltage of 80 keV, at a dose of $8.0 \times 10^{15}$ atoms/cm$^2$. During this doping process, while impurity elements are also introduced into a source region and a drain region, the functionality of those regions is not lost even when low concentration impurity elements are introduced, so that there is no problem in forming high concentration impurity regions. Subsequently, the second doping process is performed at such an acceleration voltage (5 to 30 keV) that impurity elements are introduced into a semiconductor film used as a source or drain region 42, while the impurity elements are hardly introduced into semiconductor films 40 and 41 located under a gate electrode. In this embodiment mode, a doping process has been performed with $B_2H_6$ gas at an acceleration voltage of 30 keV, at a dose of $1.0 \times 10^{16}$ atoms/cm$^2$ to form a source region and a drain region, both of which are high concentration impurity regions (FIG. 8C). While the first doping process (acceleration voltage: 80–120 keV) has been performed, followed by the second doping process (acceleration voltage: 5–30 keV) in this embodiment mode, the second doping process (acceleration voltage: 5–30 keV) may be carried out before the first doping process (acceleration voltage: 80–120 keV).

Figure 8D:
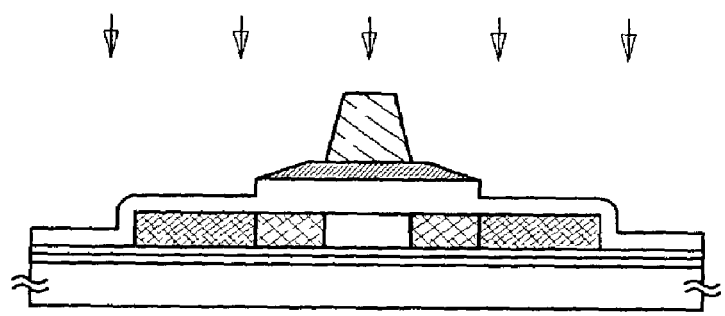
Figure 9:
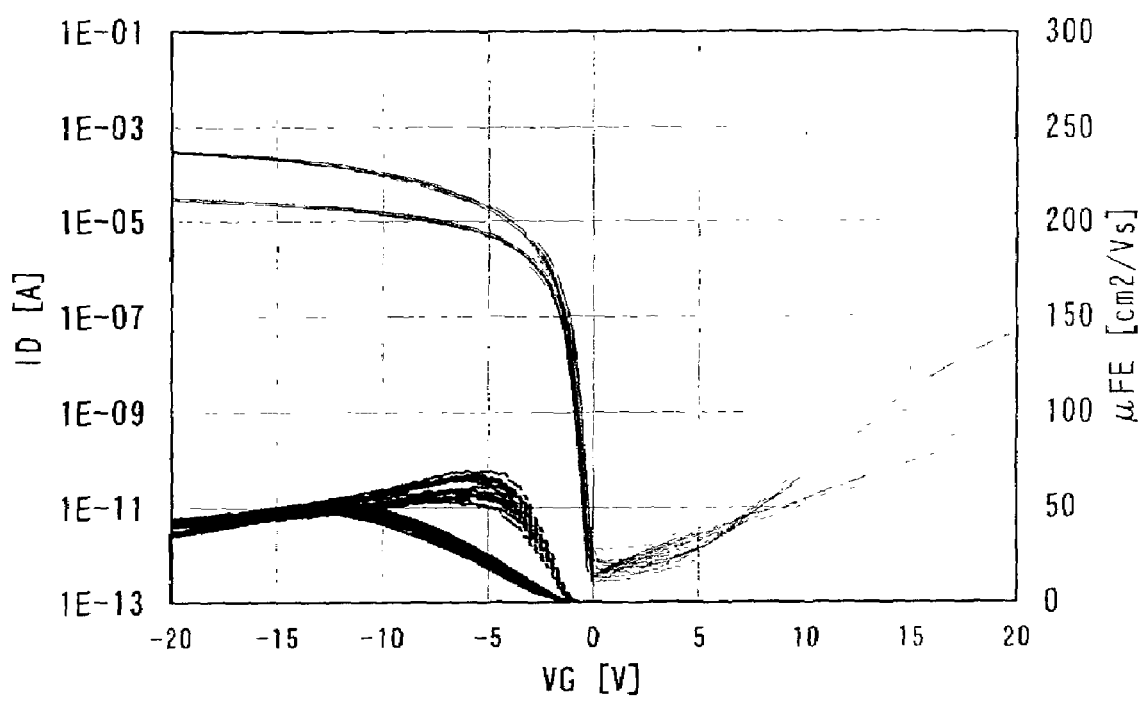
FIG. 9 is a graph showing electrical characteristics of a TFT manufactured for an experiment of the present invention.

Thereafter, a laser annealing technique or a RTA technique is applied for the activation of the impurity elements (FIG. 8D). In this embodiment mode, second harmonics of a YAG laser has been used to irradiate a top surface of a substrate. A TFT has been manufactured using a semiconductor film formed in this manner and its electrical characteristics have been measured. The result is shown in FIG. 9. Now, the measurements have been made on the TFT having channel region design values of 8 µm both in length and width. FIG. 9 shows that the TFT has good characteristics in ON current value, mobility, and S value.

In this embodiment mode, the insulating film is made a thin film, and acceleration voltages used in forming a source region and a drain region, and an LDD region are changed, thereby avoiding the formation of a concentration depth profile peak of introduced H in a semiconductor film. It can be confirmed that this method can reduce an H amount in the semiconductor film, thereby to improve electrical characteristics of a TFT.

While in this embodiment mode an insulating film over a semiconductor film has been made a thin film, followed by introducing impurity elements while changing acceleration voltages used in forming a source region and a drain region, and an LDD region, a source region and a drain region, and an LDD region may be formed in one doping process without making an insulating film a thin film. Now in this case, acceleration voltages in introducing impurity elements may be determined by an operator appropriately because optimum values depend on a TFT structure.

[Embodiment Mode 3]

This embodiment mode has changed the conditions of the presence or absence of activation, and performed hydrogenating treatment, while avoiding the formation of an H concentration depth profile peak in a semiconductor film according to Embodiment Modes 1 and 2 in association with an LDD region which a portion of a gate electrode overlaps. The results will be described.

The manufacturing steps have been proceeded to the step of forming a gate electrode according to Embodiment Modes 1 and 2, previously, wherein a 30 nm-thick TaN film has been formed as the first conductive film 14 by a sputter technique, and a 370 nm-thick W film has been formed as the second conductive film 15, followed by etching to form a gate electrode.

Subsequently, impurity elements are introduced. During this doping process, the impurity elements have been introduced at an acceleration voltage of 60–120 keV, at such a dose that the high concentration impurity region has a concentration of approximately $1 \times 10^{20}$–$1 \times 10^{21}$ atoms/cm$^3$ to avoid the formation of an H concentration depth profile peak in the semiconductor film in association with an LDD region which a portion of a gate electrode overlaps, and to make the high concentration impurity regions each serve as a low resistance region even when not activated. Of course, an optimum value of this concentration depends on a TFT structure, so that the target concentration may be determined by an operator appropriately. This embodiment mode has used $B_2H_6$ as a gas, an acceleration voltage of 60 keV, and a dose of $2.0 \times 10^6$ atoms/cm$^3$.

After that, the condition of the presence or absence of impurity element activation is allocated. In the case of performing the activation, a laser annealing technique is applied to irradiate a top surface of a substrate with second harmonics of a YAG laser.

Subsequently, an insulating film is formed over a gate electrode and a semiconductor film, followed by performing hydrogenating treatment. The hydrogenating treatment is a step for terminating dangling bonds in the semiconductor film by hydrogen contained in the insulating film. Alternatives of hydrogenating treatment may be plasma hydrogenating (plasma-excited hydrogen is used), or thermal treatment at 300–450° C. for 1–12 hours in an atmosphere containing 3–100% hydrogen. In this embodiment mode, a 100 nm-thick silicon nitride film is formed as the insulating film, followed by thermal treatment for one hour in a nitrogen atmosphere of 410° C.

Figure 20A:
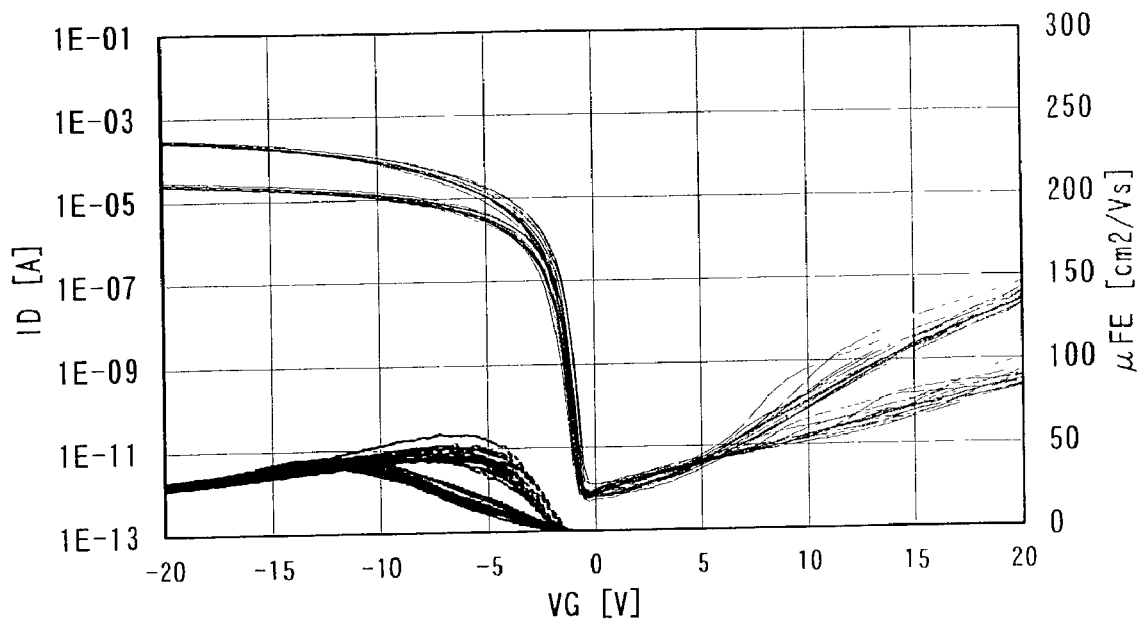
FIGS. 20A and 20B are graphs showing electrical characteristics of TFTs manufactured for experiments of the present invention.
Figure 20B:
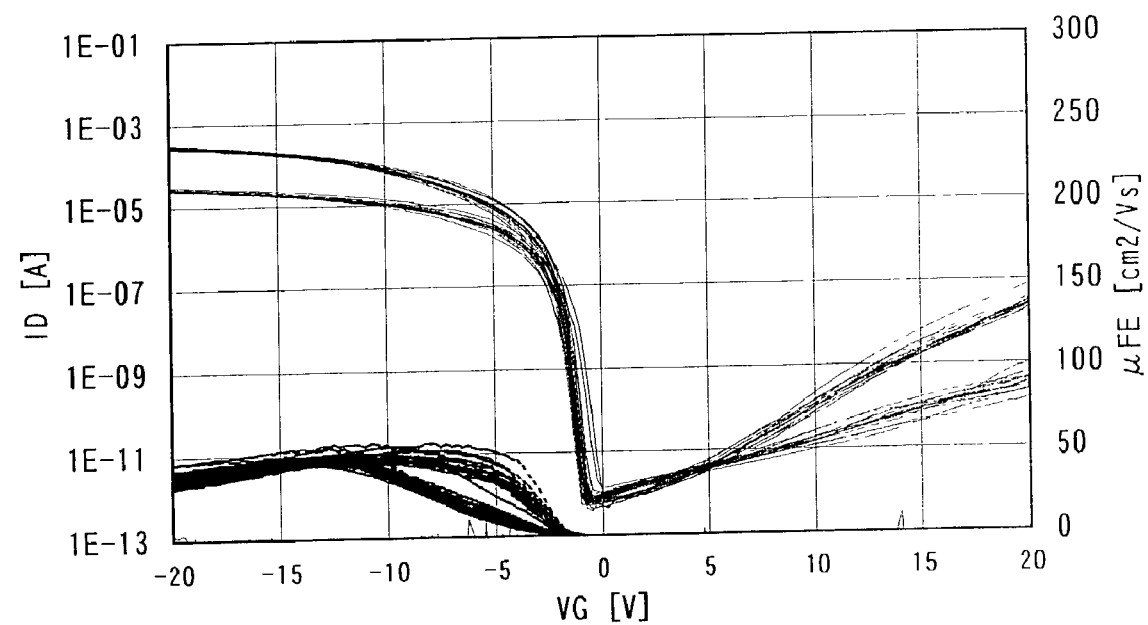

A TFT has been manufactured using a semiconductor film formed in this manner and its electrical characteristics have been measured. The results are shown in FIGS. 20A and 20B. Now, the measurements have been made on the TFTs each having channel region design values of 8 µm both in length and width. FIG. 20A shows electrical characteristics of a TFT subjected to no activation. FIG. 20B shows electrical characteristics of a TFT subjected to activation.

Both FIGS. 20A and 20B show good electrical characteristics. Consequently, it is clear that if the formation of an H concentration depth profile peak in a semiconductor film can be avoided in association with an LDD region which a portion of a gate electrode overlaps, good electrical characteristics can be achieved even with no activation.

[Embodiment Mode 4]

To avoid the formation of an H concentration depth profile peak in a semiconductor film, an acceleration voltage may be changed by a film thickness located directly above an LDD region which a portion of a gate electrode overlaps. There is a correlation between the film thickness and the acceleration voltage. Therefore, in this embodiment mode, a correlation coefficient for determining an acceleration voltage is found out.

In the case of the first embodiment mode, good electrical characteristics can be achieved when a film thickness of a first conductive layer is 50 nm and an acceleration voltage is 80 keV. Further, in the third embodiment mode, good electrical characteristics can be achieved when a film thickness of the first conductive layer is 30 nm and an acceleration voltage is 60 keV. Therefore, it is clear that the formation of an H concentration depth profile peak can be avoided under these conditions. From this, the relational expression of an acceleration voltage is found out, which makes it possible to avoid the formation of an H concentration depth profile peak in a semiconductor film. Note that in both the cases, a film thickness of a gate insulating film is 115 nm and other conditions in TFT manufacturing steps are identical. Further, the first conductive film and the gate insulating film are each etched out by 5 nm due to etching and washing. A stopping power of the first conductive film is 2.5 times as strong as a silicon film according to the values derived from our experience, and a stopping power of the gate insulating film is approximately identical to that of the silicon film.

When t1 is a film thickness of a gate insulating film, t2 is a film thickness of a conductive film, V is an acceleration voltage, α is an ion stopping power, and k is a correlation coefficient, a relational expression of them is given by:

$$V=\{t1+t2\times\alpha\}\times k.$$

Consequently, fitting a film thickness and an acceleration voltage obtained in Embodiment Mode 1 to the above equation, then $$80=\{(115-5)+(50-5)\times2.5\}\times k,$$

therefore, k=0.3596.

Fitting a film thickness and an acceleration voltage obtained in Embodiment Mode 2 to the same equation, then $$60=\{(115-5)+(30-5)\times2.5\}\times k.$$

Therefore, k=0.3478 is obtained.

Calculating an average value of these k values, then $$(0.3596+0.3478)/2=0.354.$$

Therefore, k=0.354 is obtained.

This correlation coefficient has been obtained, so that an acceleration voltage V, at which the formation of an H concentration depth profile peak in the semiconductor film can be avoided, can be found out by determining a film thickness t1 of the gate insulating film and a film thickness t2 of the gate electrode. In addition, when different doping processes are performed as in Embodiment Mode 2, an acceleration voltage V, at which the formation of an H concentration depth profile peak in the semiconductor film can be avoided, can be applied to any of the first doping process and the second doping process.

The invention made as described above will be described further in detail in reference to embodiments below.

[Embodiment 1]

In this embodiment, a method of manufacturing an active matrix substrate will be described with reference to FIGS. 10A to 13. A substrate on which a CMOS circuit, a drive circuit, and a pixel portion having a pixel TFT and a storage capacitor are formed together is called active matrix substrate for convenience.

First of all, a substrate 400 formed of glass such as barium borosilicate glass and aluminum borosilicate glass, which are representative examples of Corning #7059 glass and #1737 glass, is used in this embodiment. The substrate 400 may be a quartz substrate, a silicon substrate or a metal substrate or stainless substrate, which has an insulating film on the surface. The substrate 400 may be a plastic substrate having heat resistance, which withstands a processing temperature in this embodiment.

Next, a base film 401 having an insulating film such as silicon oxide film, silicon nitride film, and a silicon oxynitride film is formed on the substrate 400. The base film in this embodiment mode has a two-layer structure but it may be a single layer or a laminate of three or more layers using the insulating films. As a first layer of the base film 401, a silicon oxynitride film 401a is formed 10 to 200 nm (preferably 50 to 100 nm) thick by using $SiH_4$, $NH_3$ and $N_2O$ as a reaction gas in accordance with the plasma CVD method. In this embodiment, a 50 nm thick silicon oxynitride film 401a (compositional ratio: Si=32%, O=27%, N=24% and H=17%) is formed. Next, as a second layer of the base film 401, a silicon oxynitride film 401b is formed 50 to 200 nm (preferably 100 to 150 nm) thick by using $SiH_4$ and $N_2O$ as a reaction gas in accordance with the plasma CVD method. In this embodiment, a 100 nm thick silicon oxynitride film 401b (compositional ratio: Si=32%, O=59%, N=7% and H=2%) is formed.

Next, semiconductor layers 402 to 406 are formed on the base film. First of all, semiconductor film is formed 25 to 80 nm thick (preferably 30 to 60 nm) by a known method (such as the sputtering method, LPCVD method and plasma CVD method) in semiconductor layers 402 to 406. Then, the semiconductor film is crystallized by a known crystallization method (such as laser crystallization method, thermal crystallization method using RTA or a furnace annealing and thermal crystallization method using a metal element facilitating the crystallization). Patterning is performed on the obtained crystalline semiconductor film in a desired shape in order to form the semiconductor layers 402 to 406. The semiconductor film may be an amorphous semiconductor film, a fine crystal semiconductor film or a crystalline semiconductor film. Alternatively, the semiconductor film may be a compound semiconductor film having an amorphous structure such as an amorphous silicon germanium film. In this embodiment, plasma CVD method is used to form an amorphous silicon film with a thickness of 55 nm. Solution containing nickel is held on the amorphous silicon film. After the dehydrogenation (at 500° C. for one hour) is performed on the amorphous silicon film, thermal crystallization (at 550° C. for four hours) is performed thereon. Then, the semiconductor layers 402 to 406 are formed by performing patterning processing thereon by using the photolithography method.

When a crystalline semiconductor film is produced in accordance with the laser crystallization method, excimer laser of the pulse oscillation type or the continuous light emitting type, YAG laser, $YVO_4$ laser, YLF laser, $YAlO_3$ laser, glass laser, ruby laser or Ti: sapphire laser may be applied. When these types of laser are used, a method is preferable whereby laser light emitted from a laser oscillator is condensed by an optical system and is irradiated to a semiconductor film. The condition of the crystallization may be selected by the practitioner as necessary. However, when excimer laser is used, the pulse frequency is 300 Hz and the laser energy density is 100 to 700 mJ/cm² (typically 200 to 300 mJ/cm²). Preferably, when YAG laser is used, the second harmonic is used, and the pulse frequency is 1 to 300

Hz. The laser energy density is preferably 300 to 1000 mJ/cm$^2$ (typically 350 to 500 mJ/cm$^2$). Then, laser light condensed linearly of 100 to 1000 μm wide, for example 400 μm wide in this embodiment, is irradiated all over the surface of the substrate. The overlap rate of the linear beams may be set at 50 to 98%.

The amorphous silicon film is crystallized by using a metal element facilitating the crystallization in this embodiment. Therefore, the metal element remains in the crystalline silicon film. The metal element is removed as follows: First of all, an amorphous silicon film 50 to 100 nm thick is formed on the crystalline silicon film. Then, thermal treatment (such as RTA method or thermal annealing using an annealing furnace) is performed thereon. Then, the metal element is diffused in the amorphous silicon film, and the amorphous silicon is removed by etching after heating processing. Thus, the metal element contained in the crystalline silicon film can be reduced or removed.

After the semiconductor layers 402 to 406 are formed, a small amount of impurity element (boron or phosphorus) may be doped in order to control a threshold value of the TFT.

Next, a gate insulating film 407 covering the semiconductor layers 402 to 406 is formed. The gate insulating film 407 is formed by using an insulating film with a thickness of 40 to 150 nm containing silicon in accordance with plasma CVD method or sputtering method. In this embodiment, a silicon oxynitride film (composition ratio: Si=32%, O=59%, N=7% and H=2%) with a thickness of 110 nm is formed in accordance with the plasma CVD method. Notably, the gate insulating film is not limited to the silicon oxynitride film but other insulating film containing silicon may be used as a single layer or as a laminated structure.

When a silicon oxide film is used, it is formed by mixing Tetraethyl Orthosilicate (TEOS) and O$_2$ by plasma CVD method, which is discharged under a condition with reaction pressure of 40 Pa, a substrate temperature of 300 to 400° C., high frequency (13.56 MHz), and power density of 0.5 to 0.8 W/cm$^2$. Thermal annealing at 400 to 500° C. thereafter can give good characteristics to the silicon oxide film produced in this way as a gate insulating film.

Figure 10A:
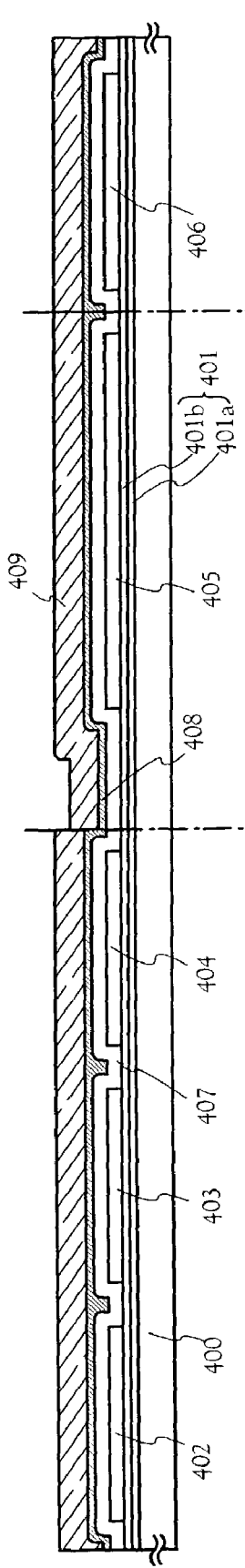
FIGS. 10A to 10C are cross-sectional views showing manufacturing steps of a pixel TFT and a drive circuit TFT of Embodiment 1.

Next, a first conductive film 408 with a thickness of 20 to 100 nm and a second conductive film 409 with a thickness of 100 to 400 nm are stacked on the gate insulating film 407. In this embodiment, the first conductive film 408 formed by a TaN film with a thickness of 30 nm and the second conductive film 409 formed by a W film with a thickness of 370 nm are stacked. The TaN film is formed by using Ta target to perform sputtering in an atmosphere containing nitrogen. The W film is formed by sputtering with W as a target. Alternatively, the W film can also be formed by a thermal CVD method using tungsten hexafluoride (WF$_6$). Whichever is used, it is necessary to make the film low resistant in order to use it as the gate electrode, and it is preferable that the resistivity of the W film be set 20 μΩcm or less. The resistivity can be lowered by enlarging the crystal grain of the W film, but for cases where there are many impurity elements such as oxygen within the W film, crystallization is inhibited, and the film becomes high resistant. Therefore, a W target having a high purity (purity of 99.9999%) is thus used in sputtering. In addition, by forming the W film while taking sufficient care such that no impurities from the inside of the gas phase are introduced at the time of film formation, a resistivity of 9 to 20 μΩcm can be achieved. (FIG. 10A)

Note that although the first conductive film 408 and the second conductive film 409 are formed from TaN and W, respectively, in this Embodiment, the conductive films are not limited to these. Both the first conductive film 408 and the second conductive film 409 may also be formed from an element selected from the group consisting of Ta, W, Ti, Mo, Al, Cu, Cr, and Nd or from an alloy material or a chemical compound material having one of these elements as its main constituent. Further, a semiconductor film, typically a polysilicon film, into which an impurity element such as phosphorous is doped, may also be used. An AgPdCu alloy may also be used. A combination of the first conductive film formed by a tantalum (Ta) film and the second conductive film formed by a W film, a combination of the first conductive film formed by a titanium nitride (TiN) and the second conductive film formed by a W film, a combination of the first conductive film formed by a tantalum nitride (TaN) film and the second conductive film formed by an Al film, or a combination of the first conductive film formed by a tantalum nitride (TaN) film and the second conductive film formed by a Cu film is possible.

Figure 10B:
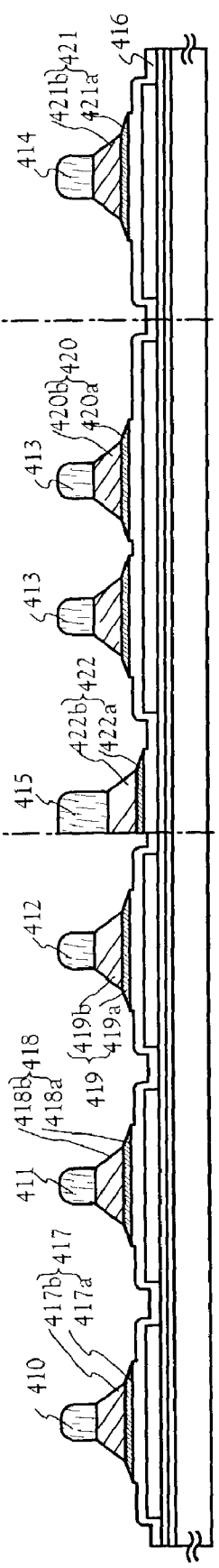

Next, resist masks 410 to 415 using photolithography method are formed, and first etching processing is performed thereon in order to form electrodes and wirings. The first etching processing is performed under first and second etching conditions (FIG. 10B). The first etching condition in this embodiment is to use Inductively Coupled Plasma (ICP) etching and to use CF$_4$, Cl$_2$ and O$_2$ as an etching gas, whose amount of gas flows are 25/25/10 (sccm), respectively. 500 W of RF (13.56 MHz) power was supplied to a coil type electrode by 1 Pa pressure in order to generate plasma and then to perform etching. 150 W of RF (13.56 MHz) power was also supplied to a substrate side (sample stage) and substantially negative self-bias voltage was applied. The W film was etched under the first etching condition so as to obtain the end of the first conductive layer in a tapered form.

After that, the first etching condition is shifted to the second etching condition without removing the resist masks 410 to 415. Then, CF$_4$ and Cl$_2$ are used as etching gases. The ratio of the amounts of flowing gasses is 30/30 (sccm). 500 W of RF (13.56 MHz) power is supplied to a coil type electrode by 1 Pa pressure in order to generate plasma and then to perform etching for amount 30 seconds. 20 W of RF (13.56 MHz) power is also supplied to a substrate side (sample stage) and substantially negative self-bias voltage is applied. Under the second etching condition where CF$_4$ and Cl$_2$ are mixed, both W film and TaN film were etched to the same degree. In order to etch without leaving a residue on the gate insulating film, the etching time may be increased 10 to 20% more.

In the first etching processing, when the form of the resist mask is appropriate, the form of the ends of the first and the second conductive layers are in the tapered form due to the effect of the bias voltage applied to the substrate side. The angle of the tapered portion is 15 to 45°. Thus, conductive layers 417 to 422 in a first form are formed which include the first conductive layers and the second conductive layers (first conductive layers 417a to 422a and second conductive layer 417b to 422b) through the first etching processing. In a gate insulating film 416, an area not covered by the first conductive layers 417 to 422 is etched by about 20 to 50 nm so as to form a thinner area.

Figure 10C:
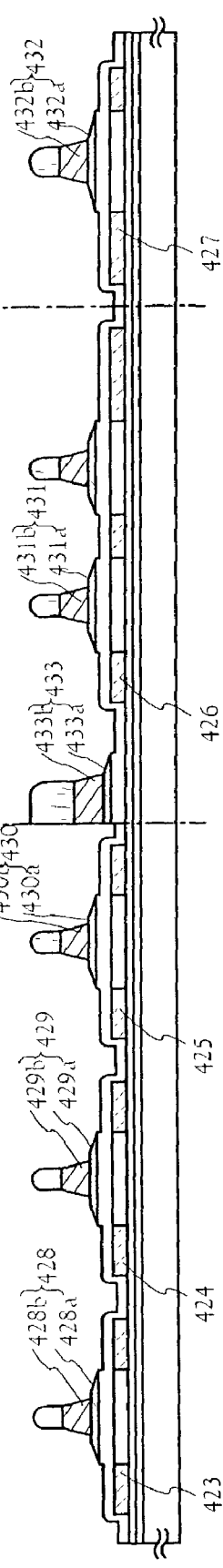

Next, second etching processing is performed without removing resist masks (FIG. 10C). Here, CF$_4$, Cl$_2$ and O$_2$ are used as the etching gas to etch the W film selectively. Then, second shape second conductive layers 428b to 433b are formed by the second etching processing. On the other hand, the first conductive layers 417a to 422a are almost never etched, and second shape first conductive layers 428a to 433a are formed. Thus, the second shape conductive layers 428 to 433 are formed.

First doping processing is performed without removing resist masks and low density of impurity element, which gives n-type to the semiconductor layer, is added. The doping processing may be performed in accordance with the ion-doping method or the like. The ion doping method is performed under a condition in the dose of $1\times10^{13}$ to $5\times10^{14}/cm^2$ and the accelerating voltage of 40 to 80 keV. In this embodiment, the ion doping method is performed under a condition in the dose of $1.5\times10^{13}/cm^2$ and the accelerating voltage of 60 keV. The n-type doping impurity element may be Group 15 elements, typically phosphorus (P) or arsenic (As) using each of $PH_3$ or As. Here, phosphorus (P) is used. In this case, the conductive layers 428 to 433 function as masks for the n-type doping impurity element. Therefore, impurity areas 423 to 427 are formed in the self-alignment manner. An n-type doping impurity element in the concentration range of $1\times10^{18}$ to $1\times10^{20}/cm^3$ is added to the impurity areas 423 to 427. (FIG. 10D)

When resist masks are removed, new resist masks 434a to 434c are formed. Then, second doping processing is performed by using higher accelerating voltage than that used in the first doping processing. The ion doping method is performed under a condition in the dose of $1\times10^{13}$ to $1\times10^{15}/cm^2$ and the accelerating voltage of 60 to 120 keV. In the doping processing, the second conductive layers 428b to 432b are used as masks against the impurity element. Doping is performed such that the impurity element can be added to the semiconductor layer at the bottom of the tapered portion of the first conductive layer. Then, third doping processing is performed by having lower accelerating voltage than that in the second doping processing to obtain a condition shown in FIG. 11A. The ion doping method is performed under a condition in the dose of $1\times10^{15}$ to $1\times10^{17}/cm^2$ and the accelerating voltage of 50 to 100 keV. Through the second doping processing and the third doping processing, an n-type doping impurity element in the concentration range of $1\times10^{18}$ to $5\times10^{20}/cm^3$ is added to the low concentration impurity areas 436, 442 and 448, which overlap with the first conductive layer. An n-type doping impurity element in the concentration range of $1\times10^{19}$ to $5\times10^{21}/cm^3$ is added to the high concentration impurity areas 435, 441, 444, 447, and 480.

The second doping processing and the third doping processing are divided in the semiconductor film in which n-channel type TFT is formed in this embodiment. Therefore, it is possible to reduce the concentration of hydrogen of LDD regions 436, 442, and 448, which overlap with one part of the gate electrodes 428, 430, and 432. Of course, it may also be possible to reduce the concentration of hydrogen of the LDD regions which overlap with one part of the gate electrodes even if the low concentration impurity region and the high concentration impurity region are formed by performing the second doping processing and the third doping processing with a suitable accelerating voltage.

Next, after removing resist masks, new resist masks 450a to 450c are formed to perform the fourth doping processing. Through the fourth doping processing, impurity areas 453, 454, 459 and 460, to which an impurity element doping a conductive type opposite to the one conductive type is added, in a semiconductor layer, which become to an active region of a p-channel type TFT. Second conductive layers 429a to 432a are used as mask against the impurity element, and the impurity element giving p-type is added so as to form impurity areas in the self-alignment manner. To avoid the formation of the peak of the concentration profile of H in the semiconductor film, the accelerating voltage of TFT is set to 80 to 120 keV and impurity element is introduced in TFT fabricated in this embodiment. In this embodiment, the impurity areas 453 to 456,459 and 460 are formed by applying ion-doping method using diborane ($B_2H_6$) and accelerating voltage of them is set to 100 keV (FIG. 11B). During the fourth doping processing, the semiconductor layer forming the n-channel TFT is covered by resist masks 450a to 450c. Thorough the first to the third doping processing, phosphorus of different concentration is added to each of the impurity areas 453 and 459. Doping processing is performed such that the density of p-type doping impurity element can be $1\times10^{19}$ to $5\times10^{21}$ atoms/cm$^3$ in both areas. Thus, no problems are caused when they function as the source region and the drain region of the p-channel TFT.

Impurity regions are formed in the semiconductor layers, respectively, through the processes above.

Next, the resist masks 450a to 450c are removed and a first interlayer insulating film 461 is formed thereon. The first interlayer insulating film 461 may be an insulating film with a thickness of 100 to 200 nm containing silicon, which is formed by plasma CVD method or sputtering method. In this embodiment, silicon oxynitride film is formed is formed with a thickness of 150 nm by plasma CVD method. The first interlayer insulating film 461 is not limited to the silicon oxynitride film but may also be the other insulating films containing silicon in a single layer or in a laminated structure.

Next, as shown in FIG. 11C, a heat treatment is performed to recover the crystalline characteristic of the semiconductor layers and to activate the impurity element added to each of the semiconductor layer. The heat treatment is performed by laser annealing method. The excimer laser of the pulse oscillation type or the continuous light emitting type, YAG laser, $YVO_4$ laser, YLF laser, $YAlO_3$ laser, glass laser, ruby laser or Ti: sapphire laser may be used as the laser annealing method. An activation treatment is conducted by using $YVO_4$ laser of pulse oscillation type in this embodiment. Note that, in addition to the laser annealing method, a rapid thermal annealing method (RTA method) may also be employed.

Alternatively, the heat treatment may be performed before the first interlayer insulating film is formed. However, when a wiring material in use is sensitive to heat, the activation treatment is preferably performed after forming an interlayer insulating film (insulating film mainly containing silicon such as silicon nitride film) for protecting the wirings as shown in this embodiment.

After the heat treatment (heat treatment at 300 to 550° C. for 1 to 12 hours) is performed, hydrogenation can be performed. This process terminates the dangling bond of the semiconductor layer with hydrogen contained in the first interlayer insulating film 461. The semiconductor layer can be hydrogenated regardless of the existence of the first interlayer insulating film. Alternatively, the hydrogenation may be plasma hydrogenation (using hydrogen excited by plasma) or heat treatment in an atmosphere containing 3 to 100% of hydrogen at 300 to 450° C. for 1 to 12 hours.

Next, a second interlayer insulating film 462 formed by an inorganic insulating material or an organic insulating material is formed on the first interlayer insulating film 461. In this embodiment, an acrylic resin film 1.6 μm thick is formed, whose viscosity is 10 to 1000 cp, preferably 40 to 200 cp and which has depressions and projections formed on the surface.

In this embodiment, in order to prevent mirror reflection, a second interlayer insulating film 462 having projections and depressions on the surface is formed. Thus, the projections and depressions are formed on the surface of the pixel electrode. In order to obtain an effect of light dispersion by forming the depressions and projections on the surface of the pixel electrode, a projecting portion may be formed under the pixel electrode. In this case, the projecting portion can be formed by using the same photograph mask for forming a TFT. Thus, the projecting portion can be formed without any increase in the number of steps. The projecting portion may be provided as necessary on the substrate in the pixel area except for wirings and the TFT portion. Accordingly, projections and depressions can be formed on the surface of the pixel electrode along the projections and depressions formed on the surface of an insulating film covering the projecting portion.

Alternatively, the second interlayer insulating film 462 may be a film having a flattened surface. In this case, after the pixel electrode is formed, projections and depressions are formed on the surface by performing an added process such as known sandblast method and etching method. Preferably, by preventing mirror reflection and by dispersing reflected light, the whiteness is increased.

Figure 12:
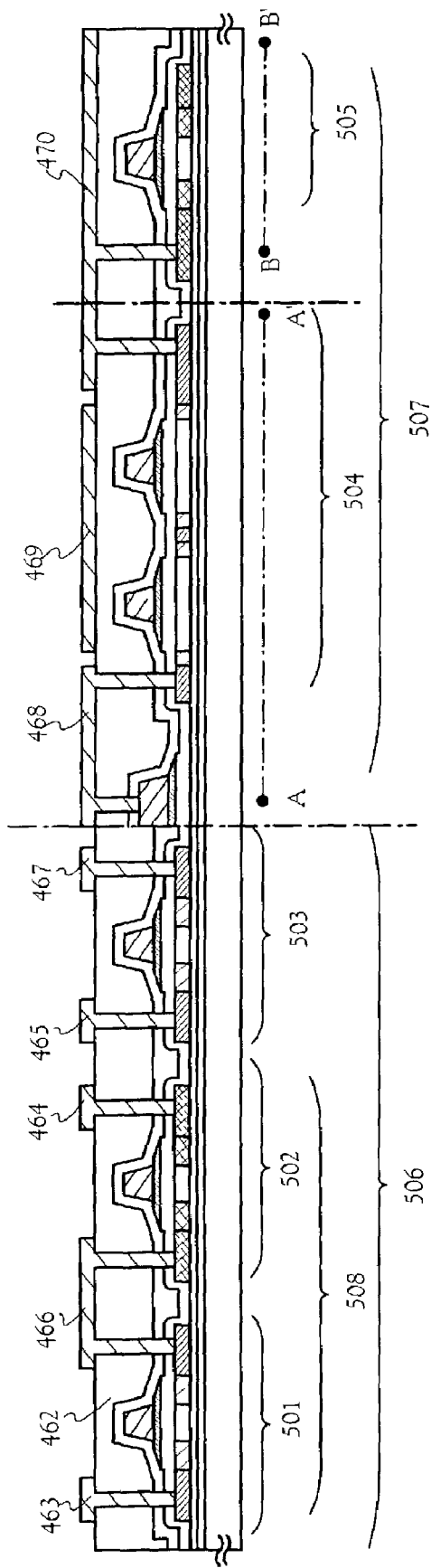
FIG. 12 is a cross-sectional view showing manufacturing steps of a pixel TFT and a drive circuit TFT of Embodiment 1.

Wirings 463 to 467 electrically connecting to impurity regions, respectively, are formed in a driver circuit 506. These wirings are formed by patterning a film laminating a Ti film with a thickness of 50 nm and an alloy film (alloy film of Al and Ti) with a thickness of 500 nm. It is not limited to the two-layer structure but may be a one-layer structure or a laminate structure including three or more layers. The materials of the wirings are not limited to Al and Ti. For example, the wiring can be formed by forming Al or Cu on a TaN film and then by patterning the laminate film in which a Ti film is formed (FIG. 12).

In a pixel portion 507, a pixel electrode 470, a gate wiring 469 and a connecting electrode 468 are formed. Source wirings (a laminate of layers 443a and 443b) are electrically connected with a pixel TFT by the connecting electrode 468. The gate wiring 469 is electrically connected with a gate electrode of the pixel TFT. A pixel electrode 470 is electrically connected with a drain region 480 of the pixel TFT. Furthermore, the pixel electrode 470 is electrically connected with a semiconductor layer 459 functioning as one electrode forming a storage capacitor. It is desirable materials for the pixel electrode 470 is highly reflective material such as a film mainly containing Al or Ag, or a laminate of a film mainly containing Al and a film mainly containing Ag.

In this way, the driver circuit 506 having a CMOS circuit 508 including an n-channel TFT 501 and a p-channel TFT 502, and an n-channel TFT 503, and the pixel portion 507 having the pixel TFT 504 and the storage capacitor 505 can be formed on the same substrate. Thus, an active matrix substrate is completed.

The n-channel TFT 501 of the driving circuit 506 has the channel formation region 437, the low-concentration impurity regions 436 (GOLD regions) overlapped with the first conductive layer 428a constituting a part of a gate electrode and the high-concentration impurity regions 435 that function as a source region or a drain region. The p-channel TFT 502 constituting a CMOS circuit 508 by being connected to the n-channel TFT 501 through the electrode 466 has the channel formation region 451, the high-concentration impurity regions 453 that function as a source region or a drain region, and the impurity regions 454 in which an impurity element imparting n-type and an impurity element imparting p-type are introduced. Furthermore, the n-channel TFT 503 has the channel-formation region 443, the low-concentration impurity regions 442 (GOLD regions) overlapped with the first conductive layer 430a constituting a part of a gate electrode, the high-concentration impurity regions 441 that function as a source region or a drain region.

The pixel TFT 504 of the pixel portion has the channel formation regions 446, the low-concentration impurity regions 445 (lightly doped drain (LDD) regions) formed outside of a gate electrode, the high-concentration impurity regions 444 that function as a source region or a drain region, and the impurity region 457 in which an impurity element imparting n-type and an impurity element imparting p-type are introduced. Furthermore, an impurity element imparting n-type and an impurity element imparting p-type are added to the semiconductor layer that functions as one electrode of the storage capacitor 505. The storage capacitor 505 is composed of an electrode (layered structure 432a and 432b) and the semiconductor layer using the insulating film 416 as a dielectric.

In the pixel configuration of the present embodiment, the edges of the pixel electrode are disposed so as to be overlapped with a source wiring such that a gap between pixel electrodes is light-shielded without using a black matrix.

Figure 13:
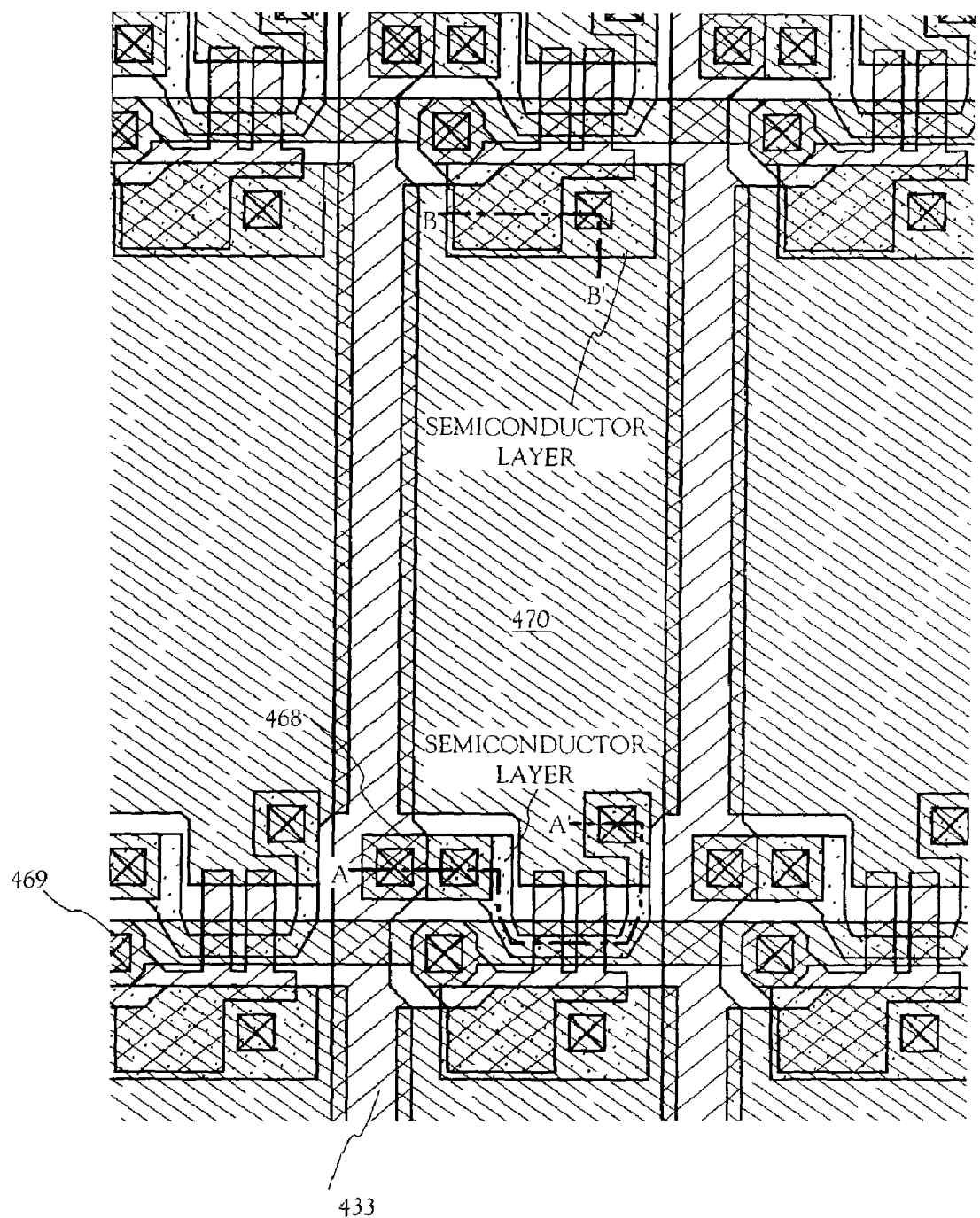
FIG. 13 is a plan view showing a configuration of a pixel TFT of Embodiment 1.

Furthermore, FIG. 13 shows a top view of a pixel portion of an active matrix substrate manufactured in the present embodiment. Corresponding portions in FIGS. 10A to 13 are denoted with the same reference numerals. A broken line A—A' in FIG. 12 corresponds to a cross-section taken along with a broken line A—A' in FIG. 13. A broken line B—B' in FIG. 12 corresponds to a cross-section taken along with a broken line B—B' in FIG. 13. The present embodiment can be arbitrarily combined with any one of first or second embodiment modes.

[Embodiment 2]

Figure 14:
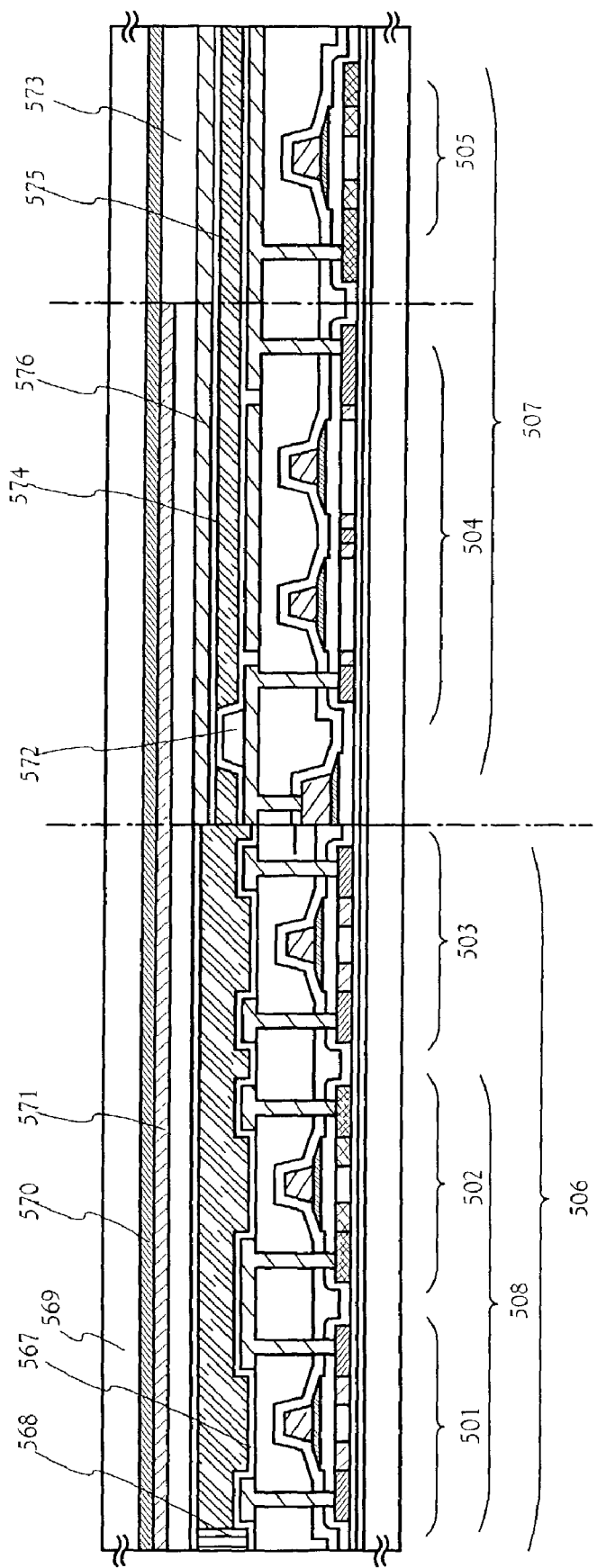
FIG. 14 is a cross-sectional view showing manufacturing steps of an active-matrix liquid crystal display of Embodiment 2.

In the present embodiment, the processes of manufacturing a reflection type liquid crystal display device using the active matrix substrate manufactured in Embodiment 1 will be described with reference to FIG. 14.

First, in accordance with Embodiment 1, the active matrix substrate as shown in FIG. 12 is obtained. Thereafter, an alignment film 567 is formed at least on a pixel electrode 470 on the active matrix substrate in FIG. 12, and a rubbing treatment is conducted. In the present embodiment, before forming the alignment film 567, an organic resin film such as an acrylic resin film was patterned, whereby a column-shaped spacer 572 for holding a substrate gap was formed at a desired position. Furthermore, spherical spacers may be scattered over the entire surface of the substrate, in place of column-shaped spacers.

Then, a counter substrate 569 is prepared. Coloring layers 570 and 571, and a leveling film 573 are formed on the counter substrate 569. The red coloring layer 570 is overlapped with the blue coloring layer 571 to form a light-shielding portion. It may also be possible that a red coloring layer is partially overlapped with a green coloring layer to form a light-shielding portion.

In the present embodiment, the substrate described in Embodiment 1 is used. Therefore, in FIG. 13 showing a top view of the pixel portion in Embodiment 1, it is required that at least the gap between the gate wiring 469 and the pixel electrode 470, the gap between the gate wiring 469 and the connection electrode 468, and the gap between the connection electrode 468 and the pixel electrode 470 should be light-shielded. In the present embodiment, each coloring layer was disposed so that a light-shielding portion composed of a stack of coloring layers was overlapped with positions to be light-shielded, under which condition the counter substrate was attached.

As described above, the gap between the respective pixels is light-shielded with a light-shielding portion composed of a stack of coloring layers, whereby the number of processes can be reduced, without forming a light-shielding layer such as a black mask.

Then, a counter electrode 576 composed of a transparent conductive film is formed on the leveling film 573 at least in the pixel portion, and an alignment film 574 is formed over the entire surface of the counter substrate, whereby a rubbing treatment was conducted.

Then, the active matrix substrate on which the pixel portion and the driving circuit are formed and the counter substrate are attached to each other with a sealant 568. A filler is mixed in the sealant 568, and two substrates are attached to each other at a uniform interval with the filler and column spacers. Thereafter, a liquid crystal material 575 is injected between the substrates, and the substrates are completely sealed with a sealant (not shown). A known liquid crystal material may be used for the liquid crystal material 575. Thus, a reflection type liquid crystal display device shown in FIG. 14 is completed. If required, the active matrix substrate or the counter substrate is separated in a desired shape. Furthermore, a polarizing plate (not shown) was attached to only the counter substrate. Then, a flexible printed circuit (FPC) was attached by a known technique.

The H concentration in the semiconductor film of the liquid crystal display device manufactured as described above is decreased more than so far, and the liquid crystal display device can provide good operation characteristic and high reliability. Also, the liquid crystal display device can be used as a display portion of various electronic equipment.

The present embodiment can be arbitrarily combined with any one of first or second embodiment modes.

[Embodiment 3]

In the present embodiment, an example of fabricating a light-emitting device will be described using the present invention. In the present specification, a light-emitting device collectively refers to a display panel in which a light-emitting element formed on a substrate is sealed between the substrate and a cover member and a display module in which an IC is mounted on the display panel. A light-emitting element includes a layer (light-emitting layer) containing an organic compound that allows electro luminescence generated by application of an electric field to be obtained, an anode layer, and a cathode layer. Furthermore, luminescence in an organic compound includes fluorescence obtained when a singlet excited state returns to a normal state and phosphorescence obtained when a triplet excited state returns to a normal state. Either one of or both of emission light is included.

In the present specification, all the layers formed between an anode and a cathode in a light-emitting element are defined as organic light-emitting layers. Specifically, the organic light-emitting layers include a light-emitting layer, a hole injection layer, an electron injection layer, a hole transport layer, an electron transport layer, etc. A light-emitting element has a basic structure in which an anode layer, a light-emitting layer, and a cathode layer are successively stacked. In addition to the above-mentioned structure, the light-emitting element may have a structure in which an anode layer, a hole injection layer, a light-emitting layer, and a cathode layer are successively stacked, a structure in which an anode layer, a hole injection layer, a light-emitting layer, an electron transport layer, and a cathode layer are successively stacked, etc.

Figure 15:
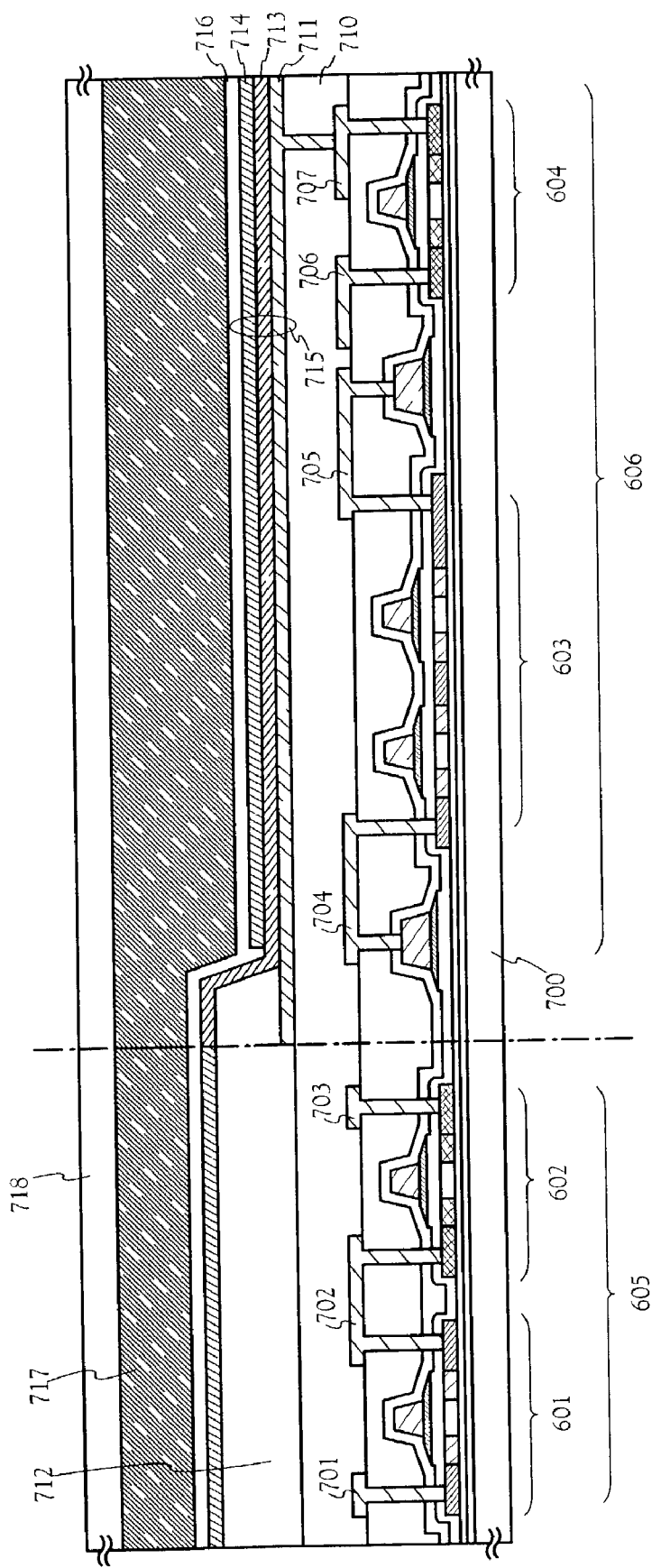
FIG. 15 is a structural cross-sectional view showing a drive circuit and a pixel unit of a light emitting device of Embodiment 3.

FIG. 15 is a cross-sectional view of a light-emitting device of the present embodiment. In FIG. 15, a switching TFT 603 provided in a pixel portion 606 on a substrate 700 is formed by using the n-channel TFT 504 in FIG. 12. Regarding the configuration of the switching TFT 603, the description of the n-channel TFT 504 may be referred to.

Although the present embodiment shows a double-gate structure in which two channel-formation regions are formed, a single-gate structure in which one channel-formation region is formed or a triple-gate structure in which three channel-formation regions are formed may be used.

A driving circuit 605 provided on the substrate 700 is formed by using the CMOS circuit 508 shown in FIG. 12. Therefore, regarding the description of the configuration of the driving circuit, the description of the n-channel TFT 501 and the p-channel TFT 502 may be referred to. Although the present embodiment shows a single-gate structure in the n-channel TFT 601 and the p-channel TFT 602, a double-gate structure or a triple-gate structure may be used.

Furthermore, wirings 701 and 703 function as source wirings of a CMOS circuit, and a wiring 702 functions as a drain wiring. A wiring 704 functions as a wiring for electrically connecting a source wiring 708 to a source region of a switching TFT, and a wiring 705 functions as a wiring for electrically connecting a drain wiring 709 to a drain region of a switching TFT.

A current control TFT 604 is formed by using the p-channel TFT 502 in FIG. 12. Therefore, regarding the description of the current control TFT 604, the description of the p-channel TFT 502 may be referred to. Although the present embodiment shows a single-gate structure, a double-gate substrate or a triple-gate structure may be used.

A wiring 706 is a source line (corresponding to a current supply line) of the current control TFT 604, and reference numeral 707 denotes an electrode that is electrically connected to a pixel electrode 711 by being overlapped with the pixel electrode 711 of the current control TFT. The pixel electrode 711 is a pixel electrode (an anode of a light-emitting element), made of a transparent conductive film. As the transparent conductive film, a compound of indium oxide and tin oxide, a compound of indium oxide and zinc oxide, zinc oxide, tin oxide, or indium oxide can be used. The transparent conductive film with gallium added thereto may be used. The pixel electrode 711 is formed on a leveling interlayer insulating film 710 before forming the above-mentioned wiring. In the present embodiment, it is very important to flatten the step difference caused by TFTs by using a leveling film 710 made of a resin. A light-emitting layer to be formed later is very thin, so that light-emission defects may be caused due to the presence of the step difference. Therefore, it is desirable that the surface is flattened before forming pixel electrodes so that the light-emitting layer can be formed on a flat surface.

After the wirings 701 to 707 are formed, a bank 712 is formed as shown in FIG. 15. The bank 712 may be formed by patterning an insulating film or an organic resin film with a thickness of 100 to 400 nm containing silicon.

Since the bank 712 is made of an insulating film, attention should be paid to electrostatic breakdown of element during film formation. In the present embodiment, a resistance ration is decreased by adding carbon particles or metal particles to an insulating film to be a material for the bank 712, whereby static electricity is suppressed. At this time, the adding amount of carbon particles or metal particles may be regulated so that the resistance ratio becomes $1\times10^6$ to $1\times10^{12}$ Ωm (preferably $1\times10^8$ to $1\times10^{10}$ Ωm).

A light-emitting layer 713 is formed on the pixel electrode 711. Although one pixel is shown in FIG. 15, light-emitting layers are formed so as to correspond to R (red), G (green), and B (blue) in the present embodiment. Furthermore, in the present embodiment, a low molecular-weight organic light-emitting material is formed by vapor deposition. More specifically, a layered structure is used in which copper phthalocyanine (CuPc) film with a thickness of 20 nm is provided as a hole injection layer, and a tris-8-quinolinolatoaluminum complex ($Alq_3$) film with a thickness of 70 nm is provided as a light-emitting layer on the hole injection layer. By adding fluorochrome such as quinacridon, perylene, or DCM1 to $Alq_3$, a light-emission color can be controlled.

It should be noted that an exemplary organic light-emitting material, which can be used as a light-emitting layer, has been described in the above, but the present embodiment is not limited thereto. A light-emitting layer (for emitting light and moving carriers for light emission) may be formed by arbitrarily combining a light-emitting layer, a charge transport layer, or a charge injection layer. In the present embodiment, a low molecular-weight organic light-emitting material is used as a light-emitting layer; however, an intermediate molecular-weight organic light-emitting material or a high molecular-weight organic light-emitting material may be used. In the present specification, an intermediate molecular-weight organic light-emitting material refers to an organic light-emitting material having no sublimation property and containing 20 or less molecules or having a length of linked molecules of 10 μm or less. Furthermore, as an example using a high molecular-weight organic light-emitting material, a layered structure may be used in which a polythiophene (PEDOT) film with a thickness of 20 nm is provided as a hole injection layer by spin coating, and a paraphenylene vinylene (PPV) film with a thickness of about 100 nm is provided on the hole injection layer as a light-emitting layer. When π-conjugated type polymer of PPV is used, a light-emission wavelength from red to blue can be selected. Furthermore, it is also possible to use an inorganic material such as silicon carbide as a charge transfer layer or a charge injection layer. As the organic light-emitting material and inorganic material, known materials can be used.

Next, a cathode 714 made of a conductive film is provided on the light-emitting layer 713. In the present embodiment, an alloy film of aluminum and lithium is used as a conductive film. Needless to say, a known MgAg film (alloy film of magnesium and silver) may be used. As a material for a cathode, a conductive film made of an element belonging to Group 1 or Group 2 of the periodic table, or a conductive film with these elements added thereto may be used.

When the cathode 714 is formed, a light-emitting element 715 is completed. The light-emitting element 715 herein refers to a diode formed of the pixel electrode (anode) 711, the light-emitting layer 713, and the cathode 714.

It is effective that a passivation film 716 is provided so as to completely cover the light-emitting element 715. As the passivation film 716, a single-layered structure or a multi-layered structure of an insulating film including a carbon film, a silicon nitride film, or a silicon oxynitride film is used.

In this case, a film with satisfactory coverage is preferably used as the passivation film. It is effective to use a carbon film, particularly, DLC (diamond-like carbon) film. Since the DLC film can be formed in a temperature range from room temperature to 100° C., the DLC film can be easily formed even above the light-emitting layer 713 with low heat resistance. Furthermore, due to a high blocking effect with respect to oxygen, the DLC film can suppress oxidation of the light-emitting layer 713. Therefore, the light-emitting layer 713 can be prevented from being oxidized while the subsequent sealing process is conducted.

Furthermore, a sealant 717 is provided on the passivation film 716, and a cover member 718 is attached to the sealant 717. As the sealant 717, a UV-curable resin may be used, and it is effective to provide a material having moisture absorbency or a material having an antioxidant effect in the sealant 717. Furthermore, in the present embodiment, as the cover member 718, a glass substrate, a quartz substrate, or a plastic substrate (including a plastic film) with a carbon film (preferably, a DLC film) formed on both sides thereof is used.

Accordingly, a light-emitting device having a configuration as shown in FIG. 15 is completed. It is effective that the process, in which the passivation film 716 is formed after the bank 712 is formed, is continuously conducted without being exposed to the atmosphere in a film-formation apparatus of a multi-chamber type (or an in-line type). It is also possible that the process up to the attachment of the cover member 718 is conducted continuously without being exposed to the atmosphere.

Furthermore, as described with reference to FIG. 15, by providing impurity regions overlapped with a gate electrode via an insulating film, an n-channel TFT that is unlikely to be degraded due to a hot-carrier effect can be formed. Therefore, a highly reliable light-emitting device can be realized.

In the present embodiment, only the configurations of a pixel portion 606 and a driving circuit 605 are shown. However, in accordance with the manufacturing processes of the present embodiment, logic circuits such as a signal division circuit, a D/A converter, an operational amplifier, and a γ-correction circuit can be formed on the same insulator. Furthermore, even a memory and a microprocessor can be formed.

The light-emitting device of the present embodiment after the sealing (or encapsulation) process for protecting a light-emitting element is conducted will be described with reference to FIGS. 16A and 16B. If required, reference numerals used in FIG. 15 will be cited.

Figure 16A:
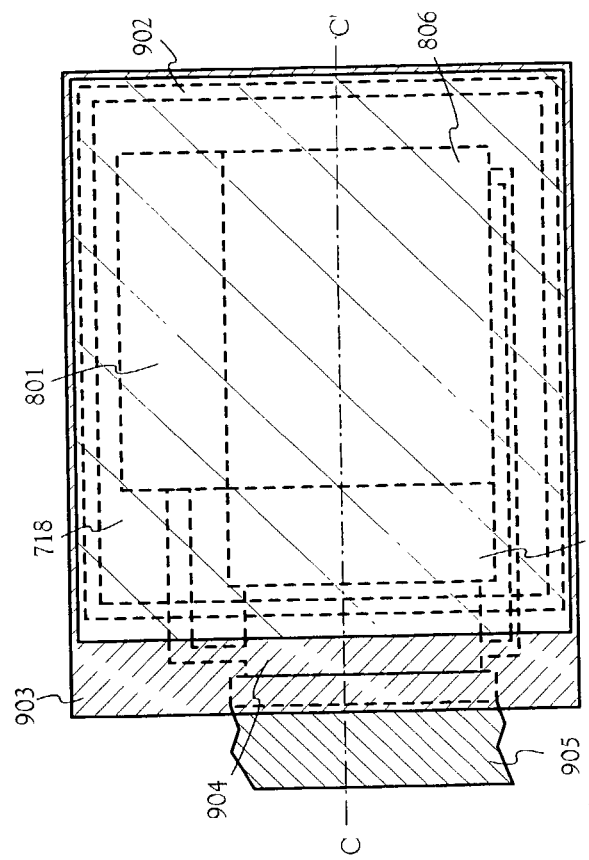
FIGS. 16A and 16B are a plan view of a light emitting device and a structural cross-sectional view of a drive circuit and a pixel unit of a light emitting device, respectively of Embodiment 3.
Figure 16B:
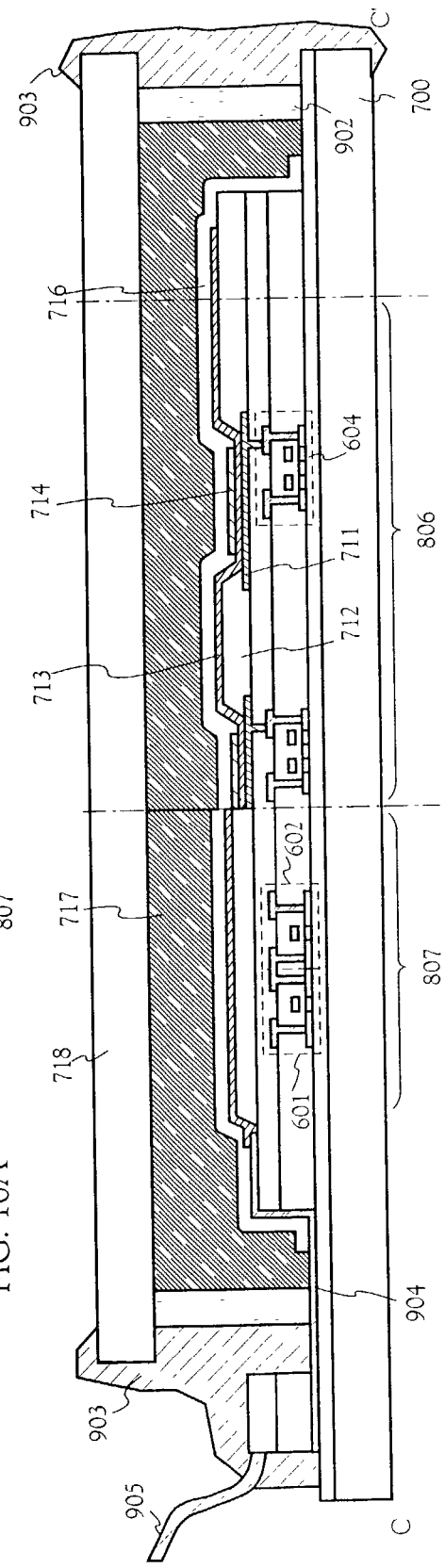

FIG. 16A is a top view showing a state in which sealing of a light-emitting element is completed. FIG. 16B is a cross-sectional view taken along a line C—C' in FIG. 16A. Portions surrounded by dotted lines and denoted with reference numerals 801, 806, and 807 are a source-side driving circuit, a pixel portion, and a gate-side driving circuit, respectively. Reference numeral 718 denotes a cover member, 902 denotes a first sealant, 903 denotes a second sealant, and a sealing material 717 is provided in an inner portion surrounded by the sealant 902.

Reference numeral 904 denotes wiring for transmitting a signal input to the source-side driving circuit 801 and the gate-side driving circuit 807 and receiving a video signal and a clock signal from a flexible printed circuit (FPC) 905 to be an external input terminal. Herein, although only an FPC is shown, a printed wiring board (PWB) may be attached to the FPC. The light-emitting device in the present specification includes not only a light-emitting device itself but also a light-emitting device with an FPC or a PWB.

Next, a cross-sectional configuration will be described with reference to FIG. 16B. The pixel portion 806 and the gate-side driving circuit 807 are formed above the substrate 700. The pixel portion 806 is composed of a current control TFT 604 and a plurality of pixels including a pixel electrode 711 electrically connected to a drain of the current control TFT 604. Furthermore, the gate-side driving circuit 807 is composed of a CMOS circuit (see FIG. 14) obtained by combining the n-channel TFT 601 with the p-channel TFT 602.

The pixel electrode 711 functions as an anode of a light-emitting element. Banks 712 is formed at both ends of the pixel electrode 711, and a light-emitting layer 713 and a cathode 714 of a light-emitting element are formed on the pixel electrode 711.

The cathode 714 functions as wiring common to all the pixels, and is electrically connected to the FPC 905 via the connection line 904. Furthermore, all the elements contained in the pixel portion 806 and the gate-side driving circuit 807 are covered with the cathode 714 and the passivation film 716. The cover member 718 is attached with the first sealant 902. Spacers made of a resin film may be provided so as to ensure a gap between the cover member 718 and the light-emitting element. An inner portion of the first sealant 902 is filled with the sealing material 717. An epoxy resin is preferably used for the first sealant 902 and the sealing material 717. It is desirable that the first sealant 902 is unlikely to transmit moisture and oxygen. Furthermore, the sealing material 717 may contain a material having moisture absorbency and an antioxidant effect.

The sealing material 717 provided so as to cover the light-emitting element also functions as an adhesive for attaching the cover member 901. In the present embodiment, as a material for a plastic substrate constituting the cover member 901, fiberglass-reinforced plastics (FRP), polyvinyl fluoride (PVF), Mylar, polyester, or acrylic resin can be used.

Furthermore, after the cover member 718 is attached with the sealing material 717, a second sealant 903 is provided so as to cover the side surfaces (exposed surfaces) of the sealing material 717. The second sealant 903 can be made of the same material as that for the first sealant 902.

By sealing the light-emitting element with the sealing material 717 in the above-mentioned configuration, the light-emitting element can be completely shut off from the outside, whereby a material accelerating degradation of the light-emitting layer due to oxidation, such as moisture and oxygen, can be prevented from entering from the outside. Thus, a highly reliable light-emitting device is obtained.

The H concentration in the semiconductor film of the light-emitting device manufactured as described above is decreased more than so far, and the light-emitting device can provide good operation characteristics and high reliability. Also, the light-emitting device can be used as a display portion of various electronic equipment.

[Embodiment 4]

Various electro-optical device (active matrix type liquid crystal display device, active matrix type light-emitting device, and active matrix type EC display device) can be manufactured by using the present invention. That is, the present invention can be implemented in all of electronic equipments integrated with the electro-optical device at display portion thereof.

As such electronic equipments, there are pointed out a video camera, a digital camera, a projector, a head mount display (goggle type display), a car navigation system, a car stereo, a personal computer, a portable information terminal (mobile computer, cellular phone or electronic book) and the like. Examples of these are shown in FIGS. 17A to 17F, 18A to 18D, and 19A to 19C.

FIG. 17A shows a personal computer including a main body 3001, an image input portion 3002, a display portion 3003, a keyboard 3004 and the like. The present invention can be applied to the display portion 3003.

FIG. 17B shows a video camera including a main body 3101, a display portion 3102, a voice input portion 3103, operation switches 3104, a battery 3105, an image receiving portion 3106 and the like. The present invention can be applied to the display portion 3102.

FIG. 17C shows a mobile computer including a main body 3201, a camera portion 3202, an image receiving portion 3203, an operation switch 3204, a display portion 3205 and the like. The present invention can be applied to the display portion 3205.

FIG. 17D shows a goggle type display including a main body 3301, a display portion 3302, an arm portion 3303 and the like. The present invention can be applied to the display portion 3302.

FIG. 17E shows a player using a record medium recorded with programs (hereinafter, referred to as record medium) including a main body 3401, a display portion 3402, a speaker portion 3403, a record medium 3404, an operation switch 3405 and the like. The player uses DVD (digital Versatile Disc), CD or the like as the record medium and can enjoy music, enjoy movie and carry out game or Internet. The present invention can be applied to the display portion 3402.

FIG. 17F shows a digital camera including a main body 3501, a display portion 3502, an eye contact portion 3503, operation switches 3504, an image receiving portion (not illustrated) and the like. The present invention can be applied to the display portion 3502.

Figure 18A:
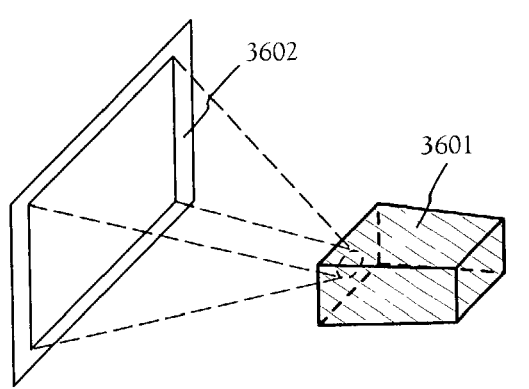
FIGS. 18A to 18D are illustrations showing examples of the semiconductor device of Embodiment 4.

FIG. 18A shows a front type projector including a projection equipment 3601, a screen 3602 and the like. The present invention can be applied to the liquid crystal display device 3808 forming a part of the projection equipment 3601 and another circuit.

Figure 18B:
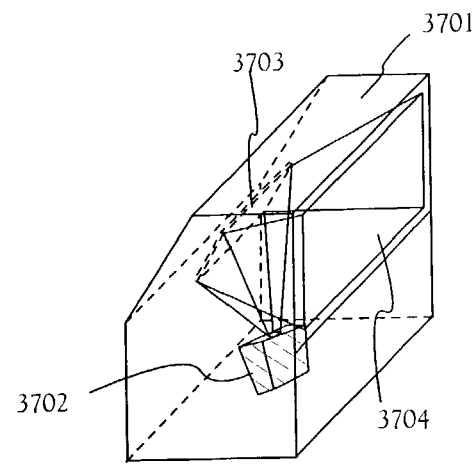

FIG. 18B shows a rear type projector including a main body 3701, a projection equipment 3702, a mirror 3703, a screen 3704 and the like. The present invention can be applied to the liquid crystal display device 3808 forming a part of the projection equipment 3702 and another circuit.

Figure 18C:
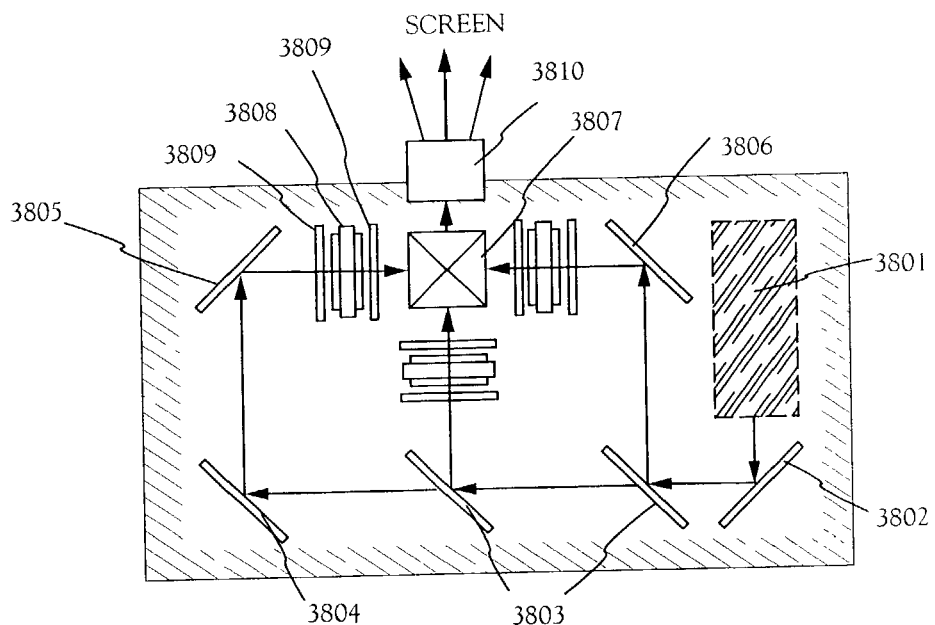

Further, FIG. 18C is a view showing an example of a structure of the projection equipment 3601 and 3702 in FIG. 18A and FIG. 18B. The projection equipment 3601 or 3702 is constituted by a light source optical system 3801, mirrors 3802, and 3804 through 3806, a dichroic mirror 3803, a prism 3807, a liquid crystal display equipment 3808, a phase difference plate 3809 and a projection optical system 3810. The projection optical system 3810 is constituted by an optical system including a projection lens. Although this embodiment shows an example of three plates type, this embodiment is not particularly limited thereto but may be of, for example, a single plate type. Further, person of executing this embodiment may pertinently provide an optical system such as an optical lens, a film having a polarization function, a film for adjusting a phase difference or an IR film in an optical path shown by arrow marks in FIG. 18C.

Figure 18D:
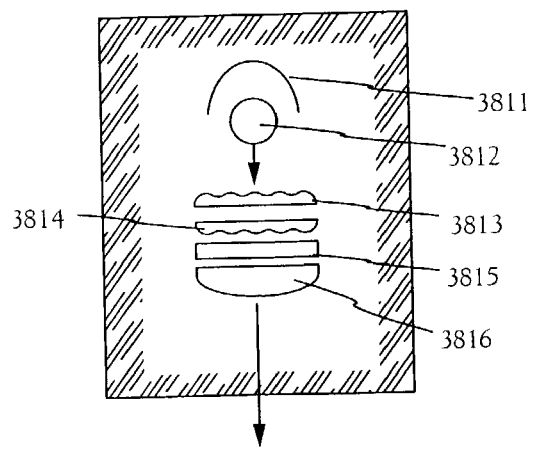

Further, FIG. 18D is a view showing an example of a structure of the light source optical system 3801 in FIG. 18C. According to this embodiment, the light source optical system 3801 is constituted by a reflector 3811, a light source 3812, lens arrays 3813 and 3814, a polarization conversion element 3815 and a focusing lens 3816. Further, the light source optical system shown in FIG. 18D is only an example and this example is not particularly limited thereto. For example, a person of executing this embodiment may pertinently provide an optical system such as an optical lens, a film having a polarization function, a film for adjusting a phase difference or an IR film in the light source optical system.

However, according to the projectors shown in FIGS. 18A to 18D, there is shown a case of using a transmission type electro-optical device, and an example of applying a reflection type electro-optical device and a light-emitting device are not illustrated.

Figure 19A:
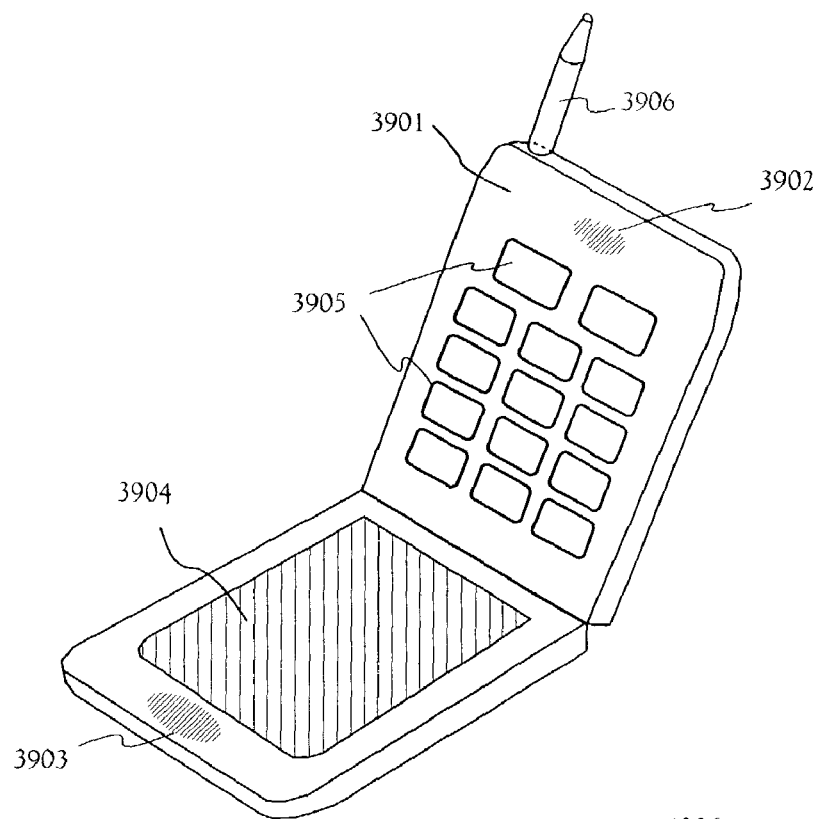
FIGS. 19A to 19C are illustrations showing applications of the semiconductor device.

FIG. 19A shows a cellular phone including a main body 3901, a sound output portion 3902, a sound input portion 3903, a display portion 3904, an operation switch 3905, an antenna 3906 and the like. The present invention can be applied to display portion 3904.

Figure 19B:
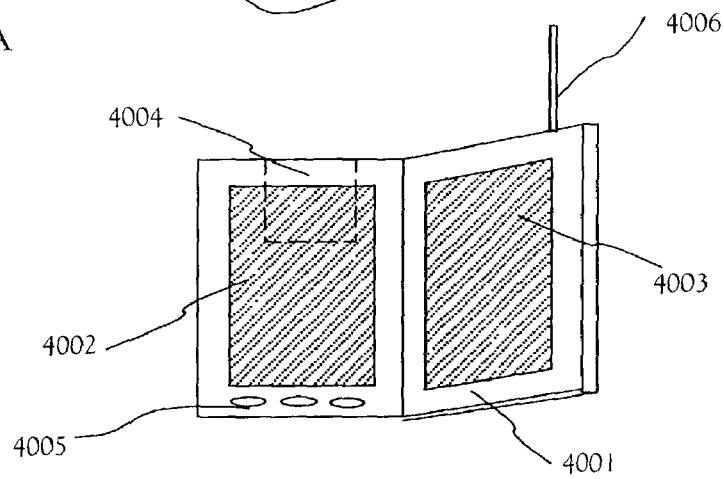

FIG. 19B shows a portable book (electronic book) including a main body 4001, display portions 4002 and 4003, a record medium 4004, an operation switch 4005, an antenna 4006 and the like. The present invention can be applied to display portions 4002 and 4003.

Figure 19C:
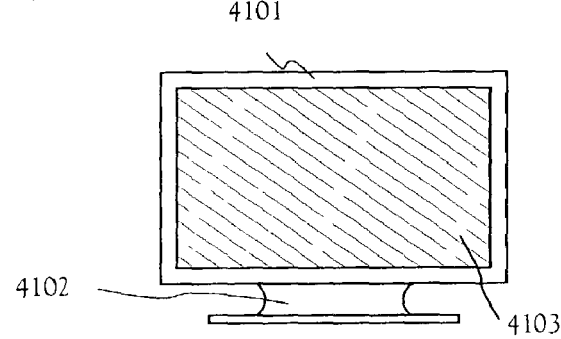

FIG. 19C shows a display including a main body 4101, a support base 4102, a display portion 4103 and the like. The present invention can be applied to display portion 4103. The display according to the invention is advantageous particularly in the case of large screen formation and is advantageous in the display having a diagonal length of 10 inch or more (particularly, 30 inch or more).

As has been described, the range of applying the present invention is extremely wide and is applicable to electronic equipment of all the fields. The electronic equipment of the present invention can be implemented by freely combined with the structures in first and second embodiment modes and Embodiments 1 to 3.

Adopting a constitution of the invention, the following fundamental advantages and benefits can be obtained.

(a) It is possible to obtain a simple method, which accommodates to conventional TFT manufacturing processes.

(b) The defects in a semiconductor film due to the introduction of impurity elements into the semiconductor film can be reduced. Consequently, it becomes possible to restore crystallinity of the semiconductor film easily.

(c) The degradation of quality of the semiconductor film can be suppressed.

(d) The throughput can be improved by using a laser annealing technique or RTA technique for impurity element activation. This is especially useful in the case of a large-sized substrate.

(e) TFTs having good electrical characteristics can be manufactured only by hydrogenating treatment even when the activation of impurity elements does not carried out. Therefore, the number of processing steps can be reduced.

(f) In addition to the foregoing advantages, the operating characteristics, reliability and yield can be improved in a semiconductor device typified by an active-matrix liquid crystal display. Also, reductions in manufacturing costs of semiconductor devices can be achieved.

What is claimed is:

1. A method for manufacturing a semiconductor device, said method comprising:
    forming a first insulating film over a substrate;
    forming a semiconductor film over the first insulating film;
    forming a second insulating film over the semiconductor film;
    forming a first conductive film over the second insulating film;
    forming a second conductive film over the first conductive film;
    first etching the first conductive film, the second conductive film, and a portion of the second insulating film to form a thin portion and a thick portion of the second insulating film;
    second etching the first conductive film and the second conductive film etched in the first etching step to form a gate electrode having the first conductive film and the second conductive film;
    first introducing a hydride having an n-type impurity element or a hydride having a p-type impurity element into the semiconductor film through the thin portion of the second insulating film using the first conductive film as a mask at a first acceleration voltage by a plasma doping technique or an ion doping technique after the second etching step;
    second introducing the hydride having an n-type impurity element or the hydride having a p-type impurity element into the semiconductor film through the first conductive film and the second insulating film using the second conductive film as a mask at a second acceleration voltage so that an H concentration depth profile peak due to $H_3$ produced by ionization of the hydride having an n-type impurity element or the hydride having a p-type impurity element is located in at least one selected from the group consisting of the thick portion of the second insulating film and the gate electrode after the first introducing step; and
    performing a thermal treatment by a laser annealing technique or a RTA technique, or a hydrogenating treatment,
    wherein the H concentration depth profile peak is not located in the semiconductor film below the gate electrode.

2. A method according to claim 1,
wherein the first acceleration voltage is in a range of 5–30keV, and the second acceleration voltage is in a range of 80–120keV.

3. A method according to claim 1,
wherein a relational expression of $V=\{t1+(t2\times\alpha)\}\times 0.35$ holds,
wherein the first acceleration voltage is in a range of 5–30keV; V is the second acceleration voltage; t1 is a film thickness of the thick portion of the second insulating film; t2 is a film thickness of the first conductive film; and $\alpha$ is an ion stopping power of the gate electrode.

4. A method according to claim 1,
wherein the laser annealing technique uses a laser selected from the group consisting of an excimer laser, a YAG laser, a $YVO_4$ laser, a YLF laser, a $YalO_3$ laser, a glass laser, a ruby laser, and a Ti: sapphire laser.

5. A method according to claim 1,
wherein the gate electrode includes a lamination structure.

6. A method according to claim 1,
wherein the semiconductor device is one selected from the group consisting of a liquid crystal display device, a light emitting device and an EC display device.

7. A method according to claim 1,
wherein the semiconductor device is one selected from the group consisting of a portable telephone, a video camera, a digital camera, a front or rear type projector, a goggle type display, a personal computer, a player using a record medium recorded with programs, a portable information terminal, a mobile computer and a display.

8. A method according to claim 1,
wherein the H concentration depth profile peak is not located in the semiconductor film below the thick portion of the second insulating film.

9. A method for manufacturing a semiconductor device, said method comprising:
forming a first insulating film over a substrate;
forming a semiconductor film over the first insulating film;
forming a second insulating film over the semiconductor film;
forming a first conductive film over the second insulating film;
forming a second conductive film over the first conductive film;
first etching the first conductive film, the second conductive film, and a portion of the second insulating film to form a thin portion and a thick portion of the second insulating film;
second etching the first conductive film and the second conductive film etched in the first etching step to form a gate electrode having the first conductive film and the second conductive film;
first introducing a hydride having an n-type impurity element or a hydride having a p-type impurity element into the semiconductor film through the thin portion of the second insulating film using the first conductive film as a mask at a first acceleration voltage by a plasma doping technique or an ion doping technique after the second etching step;
second introducing the hydride having an n-type impurity element or the hydride having a p-type impurity element into the semiconductor film through the first conductive film and the second insulating film using the second conductive film as a mask at a second acceleration voltage so that an H concentration depth profile peak due to $H_3$ produced by ionization of the hydride having an n-type impurity element or the hydride having a p-type impurity element is located in the thick portion of the second insulating film after the first introducing step; and
performing a thermal treatment by a laser annealing technique or a RTA technique, or a hydrogenating treatment,
wherein the H concentration depth profile peak is not located in the semiconductor film below the gate electrode.

10. A method according to claim 9,
wherein the first acceleration voltage is in a range of 5–30keV, and the second acceleration voltage is in a range of 80–120keV.

11. A method according to claim 9,
wherein a relational expression of $V=\{t1+(t2\times\alpha)\}\times 0.35$ holds,
wherein the first acceleration voltage is in a range of 5–30keV; V is the second acceleration voltage; t1 is a film thickness of the thick portion of the second insulating film; t2 is a film thickness of first conductive film; and $\alpha$ is an ion stopping power of the gate electrode.

12. A method according to claim 9,
wherein the laser annealing technique uses a laser selected from the group consisting of an excimer laser, a YAG laser, a $YVO_4$ laser, a YLF laser, a $YalO_3$ laser, a glass laser, a ruby laser, and a Ti: sapphire laser.

13. A method according to claim 9,
wherein the gate electrode includes a lamination structure.

14. A method according to claim 9,
wherein the semiconductor device is one selected from the group consisting of a liquid crystal display device, a light emitting device and an EC display device.

15. A method according to claim 9,
wherein the semiconductor device is one selected from the group consisting of a portable telephone, a video camera, a digital camera, a front or rear type projector, a goggle type display, a personal computer, a player using a record medium recorded with programs, a portable information terminal, a mobile computer and a display.

16. A method according to claim 9,
wherein the H concentration depth profile peak is not located in the semiconductor film below the thick portion of the second insulating film.

17. A method for manufacturing a semiconductor device, said method comprising:
forming a first insulating film over a substrate;
forming a semiconductor film over the first insulating film;
forming a second insulating film over the semiconductor film;
forming a first conductive film over the second insulating film;
forming a second conductive film over the first conductive film;
first etching the first conductive film, the second conductive film, and a portion of the second insulating film to form a thin portion and a thick portion of the second insulating film;
second etching the first conductive film and the second conductive film etched in the first etching step to form a gate electrode having the first conductive film and the second conductive film;
first introducing a hydride having an n-type impurity element or a hydride having a p-type impurity element into the semiconductor film through the thin portion of the second insulating film using the first conductive film as a mask at a first acceleration voltage by a plasma doping teclmique or an ion doping technique after the second etching step;
second introducing the hydride having an n-type impurity element or the hydride having a p-type impurity element into the semiconductor film through the first conductive film and the second insulating film using the second conductive film as a mask at a second acceleration voltage so that an H concentration depth profile peak due to $H_3$ produced by ionization of the hydride having an n-type impurity element or the hydride having a p-type impurity element is located in the gate electrode after the first introducing step; and
performing a thermal treatment by a laser annealing technique or a RTA technique, or a hydrogenating treatment,
wherein the H concentration depth profile peak is not located in the semiconductor film below tthe gate electrode.

18. A method according to claim 17,
wherein the first acceleration voltage is in a range of 5–30keV, and the second acceleration voltage is in a range of 80–120keV.

19. A method according to claim 17,
wherein a relational expression of $V=\{t1+(t2\times\alpha)\}\times0.35$ holds,
wherein the first acceleration voltage is in a range of 5–30keV; V is the second acceleration voltage; t1 is a film thickness of the thick portion of the second insulating film; t2 is a film thickness of first conductive film; and $\alpha$ is an ion stopping power of the gate electrode.

20. A method according to claim 17,
wherein the laser annealing technique uses a laser selected from the group consisting of an excimer laser, a YAG laser, a $YVO_4$ laser, a YLF laser, a $YalO_3$ laser, a glass laser, a ruby laser, and a Ti: sapphire laser.

21. A method according to claim 17,
wherein the gate electrode includes a lamination structure.

22. A method according to claim 17,
wherein the semiconductor device is one selected from the group consisting of a liquid crystal display device, a light emitting device and an EC display device.

23. A method according to claim 17,
wherein the semiconductor device is one selected from the group consisting of a portable telephone, a video camera, a digital camera, a front or rear type projector, a goggle type display, a personal computer, a player using a record medium recorded with programs, a portable information terminal, a mobile computer and a display.

24. A method according to claim 17,
wherein the H concentration depth profile peak is not located in the semiconductor film below the thick portion of the second insulating film.

25. A method for manufacturing a semiconductor device, said method comprising:
forming a first insulating film over a substrate;
forming a semiconductor film over the first insulating film;
forming a second insulating film over the semiconductor film;
forming a first conductive film over the second insulating film;
forming a second conductive film over the first conductive film;
first etching the first conductive film, the second conductive film, and a portion of the second insulating film to form a thin portion and a thick portion of the second insulating film;
second etching the first conductive film and the second conductive film etched in the first etching step to form a gate electrode having the first conductive film and the second conductive film;
first introducing a hydride having an n-type impurity element or a hydride having a p-type impurity element into the semiconductor film through the thin portion of the second insulating film using the first conductive film as a mask at a first acceleration voltage by a plasma doping technique or an ion doping technique after the second etching step; and
second introducing the hydride having an n-type impurity element or the hydride having a p-type impurity element into the semiconductor film through the first conductive film and the second insulating film using the second conductive film as a mask at a second acceleration voltage so that an H concentration depth profile peak due to $H_3$ produced by ionization of the hydride having an n-type impurity element or the hydride having a p-type impurity element is located in at least one selected from the group consisting of the thick portion of the second insulating film and the gate electrode after the first introducing step,
wherein the H concentration depth profile peak is not located in the semiconductor film below the gate electrode.

26. A method according to claim 25,
wherein the first acceleration voltage is in a range of 5–30keV,and the second acceleration voltage is in a range of 80–120keV.

27. A method according to claim 25,
wherein a relational expression of $V=\{t1+(t2\times\alpha)\}\times0.35$ holds,
wherein the first acceleration voltage is in a range of 5–30keV; V is the second acceleration voltage; t1 is a film thickness of the thick portion of the second insulating film; t2 is a film thickness of the first conductive film; and $\alpha$ is an ion stopping power of the gate electrode.

28. A method according to claim 25,
wherein the laser annealing technique uses a laser selected from the group consisting of an excimer laser, a YAG laser, a $YVO_4$ laser, a YLF laser, a $YalO_3$ laser, a glass laser, a ruby laser, and a Ti: sapphire laser.

29. A method according to claim 25,
wherein the gate electrode includes a lamination structure.

30. A method according to claim 25,
wherein the semiconductor device is one selected from the group consisting of a liquid crystal display device, a light emitting device and an EC display device.

31. A method according to claim 25,
wherein the semiconductor device is one selected from the group consisting of a portable telephone, a video camera, a digital camera, a front or rear type projector, a goggle type display, a personal computer, a player using a record medium recorded with programs, a portable information terminal, a mobile computer and a display.

32. A method according to claim 25,
wherein the H concentration depth profile peak is not located in the semiconductor film below the thick portion of the second insulating film.

33. A method for manufacturing a semiconductor device, said method comprising:
forming a first insulating film over a substrate;
forming a semiconductor film over the first insulating film;
forming a second insulating film over the semiconductor film;
forming a first conductive film over the second insulating film;
forming a second conductive film over the first conductive film;
first etching the first conductive film, the second conductive film, and a portion of the second insulating film to form a thin portion and a thick portion of the second insulating film;
second etching the first conductive film and the second conductive film etched in the first etching step to form a gate electrode having the first conductive film and the second conductive film;
first introducing a hydride having an n-type impurity element or a hydride having a p-type impurity element into the semiconductor film through the thin portion of the second insulating film using the first conductive film as a mask at a first acceleration voltage by a plasma doping technique or an ion doping technique after the second etching step; and second introducing the hydride having an n-type impurity element or the hydride having a p-type impurity element into the semiconductor film through the first conductive film and the second insulating film using the second conductive film as a mask at a second acceleration voltage so that an H concentration depth profile peak due to $H_3$ produced by ionization of the hydride having an n-type impurity element or the hydride having a p-type impurity element is located in the thick portion of the second insulating film after the first introducing step, wherein the H concentration depth profile peak is not located in the semiconductor film below the gate electrode.

34. A method according to claim 33,
wherein the first acceleration voltage is in a range of 5–30keV, and the second acceleration voltage is in a range of 80–120keV.

35. A method according to claim 33,
wherein a relational expression of $V=\{t1+(t2\times\alpha)\}\times 0.35$ holds,
wherein the first acceleration voltage is in a range of 5–30keV; V is the second acceleration voltage; t1 is a film thickness of the thick portion of the second insulating film; t2 is a film thickness of first conductive film; and cz is an ion stopping power of the gate electrode.

36. A method according to claim 33,
wherein the laser annealing technique uses a laser selected from the group consisting of an excimer laser, a YAG laser, a $YVO_4$ laser, a YLF laser, a $YalO_3$ laser, a glass laser, a ruby laser, and a Ti: sapphire laser.

37. A method according to claim 33,
wherein the gate electrode includes a lamination structure.

38. A method according to claim 33,
wherein the semiconductor device is one selected from the group consisting of a liquid crystal display device, a light emitting device and an EC display device.

39. A method according to claim 33,
wherein the semiconductor device is one selected from the group consisting of a portable telephone, a video camera, a digital camera, a front or rear type projector, a goggle type display, a personal computer, a player using a record medium recorded with programs, a portable information terminal, a mobile computer and a display.

40. A method according to claim 33,
wherein the H concentration depth profile peak is not located in the semiconductor film below the thick portion of the second insulating film.

41. A method for manufacturing a semiconductor device, said method comprising:
forming a first insulating film over a substrate;
forming a semiconductor film over the first insulating film;
forming a second insulating film over the semiconductor film;
forming a first conductive film over the second insulating film;
forming a second conductive film over the first conductive film;

first etching the first conductive film, the second conductive film, and a portion of the second insulating film to form a thin portion and a thick portion of the second insulating film;

second etching the first conductive film and the second conductive film etched in the first etching step to form a gate electrode having the first conductive film and the second conductive film;

first introducing a hydride having an n-type impurity element or a hydride having a p-type impurity element into the semiconductor film through the thin portion of the second insulating film using the first conductive film as a mask at a first acceleration voltage by a plasma doping technique or an ion doping technique after the second etching step; and second introducing the hydride having an n-type impurity element or the hydride having a p-type impurity element into the semiconductor film through the first conductive film and the second insulating film using the second conductive film as a mask at a second acceleration voltage so that an H concentration depth profile peak due to $H_3$ produced by ionization of the hydride having an n-type impurity element or the hydride having a p-type impurity element is located in the gate electrode after the first introducing step wherein the H concentration depth profile peak is not located in the semiconductor film below the gate electrode.

42. A method according to claim 41,
wherein the first acceleration voltage is in a range of 5–30keV, and the second acceleration voltage is in a range of 80–120keV.

43. A method according to claim 41,
wherein a relational expression of $V=\{t1+(t2\times\alpha)\}\times 0.35$ holds,
wherein the first acceleration voltage is in a range of 5–30keV; V is the second acceleration voltage; t1 is a film thickness of the thick portion of the second insulating film; t2 is a film thickness of first conductive film; and $\alpha$ is an ion stopping power of the gate electrode.

44. A method according to claim 41,
wherein the laser annealing technique uses a laser selected from the group consisting of an excimer laser, a YAG laser, a $YVO_4$ laser, a YLF laser, a $YalO_3$ laser, a glass laser, a ruby laser, and a Ti: sapphire laser.

45. A method according to claim 41,
wherein the gate electrode includes a lamination structure.

46. A method according to claim 41,
wherein the semiconductor device is one selected from the group consisting of a liquid crystal display device, a light emitting device and an EC display device.

47. A method according to claim 41,
wherein the semiconductor device is one selected from the group consisting of a portable telephone, a video camera, a digital camera, a front or rear type projector, a goggle type display, a personal computer, a player using a record medium recorded with programs, a portable information terminal, a mobile computer and a display.

48. A method according to claim 41,
wherein the H concentration depth profile peak is not located in the semiconductor film below the thick portion of the second insulating film.

* * * * *